United States Patent [19]

Naito

[11] Patent Number: 5,633,855
[45] Date of Patent: May 27, 1997

[54] OPTICAL INFORMATION REPRODUCTION APPARATUS

[75] Inventor: Yuichi Naito, Yokohama, Japan

[73] Assignee: Canon Kabushiki Kaisha, Tokyo, Japan

[21] Appl. No.: 574,988

[22] Filed: Dec. 19, 1995

Related U.S. Application Data

[63] Continuation of Ser. No. 432,713, May 2, 1995, abandoned.

[30] Foreign Application Priority Data

May 11, 1994 [JP] Japan .................. 6-097430

[51] Int. Cl.$^6$ ........................................ G11B 7/00
[52] U.S. Cl. .................. 369/124; 369/59; 369/120; 369/109; 369/48
[58] Field of Search .......................... 369/124, 120, 369/109, 106, 32, 43, 59, 44.25, 44.29, 44.32, 44.35, 48; 360/77.04, 77.05, 77.08

[56] References Cited

U.S. PATENT DOCUMENTS

| | | | |
|---|---|---|---|
| 5,239,531 | 8/1993 | Abe | 369/109 |
| 5,241,524 | 8/1993 | Lee | 369/109 |
| 5,248,584 | 9/1993 | Miura et al. | 369/109 |
| 5,353,271 | 10/1994 | Abe | 369/59 |
| 5,359,585 | 10/1994 | Tanoue et al. | 369/59 |
| 5,398,228 | 3/1995 | Maeda | 369/124 |
| 5,414,685 | 5/1995 | Shimizu | 369/48 |
| 5,432,771 | 7/1995 | Shido et al. | 369/124 |
| 5,434,829 | 7/1995 | Maeda et al. | 369/48 |
| 5,442,612 | 8/1995 | Takeuchi et al. | 369/124 |
| 5,444,679 | 8/1995 | Ko | 369/32 |

FOREIGN PATENT DOCUMENTS 4-162263  6/1992  Japan .

*Primary Examiner*—Loha Ben
*Attorney, Agent, or Firm*—Fitzpatrick, Cella, Harper & Scinto

[57] ABSTRACT

An optical information reproduction apparatus has a section which scans with an optical beam an optical information recording medium in which information is recorded. The optical beam is modulated according to the information. From this modulated optical beam, the corresponding reproduction signal is generated, then binary-converted. A sampling clock synchronized with this binary-converted reproduction signal is generated. The binary-converted reproduction signal is sampled with the synchronized sampling clock to reproduce the information. The response of the sampling-clock generating section can be switched. This optical information reproduction apparatus enables reliable information reproduction.

3 Claims, 14 Drawing Sheets

CENTER OF TRACK T3

OPTICAL INFORMATION REPRODUCTION APPARATUS

This application is a continuation of prior application, application Ser. No. 08/432,713 filed May 2, 1995, now abandoned.

BACKGROUND OF THE INVENTION

1. Field of the Invention

The present invention relates to optical information reproduction apparatuses for reproducing digital information recorded in an optical information recording medium, and more particularly, to an optical information reproduction apparatus for reproducing digital information by sampling a binary-converted reproduction signal with a clock signal.

2. Description of the Related Art

There are known many optical information recording media in which information is recorded with an optical beam or from which recorded information is read with an optical beam. Some of them can be recorded and reproduced, and some are reproduced only. They have various shapes, such as those of disks, cards, and tape. Among these optical information recording media, it is considered that applications for optical cards will extend due to their features of easy production, superior portability, and accessibility. Various optical information recording and reproducing apparatuses have been proposed for optical cards.

In such an optical information recording and reproducing apparatus, recording and reproduction are performed with continuous control of automatic tracking and automatic focusing. To record information on a recording medium in the apparatus, an optical beam converged to a minute spot is modulated according to the information to be recorded and an information track is scanned with the modulated optical beam. With the beam irradiation as described above, a piece of information is recorded on an information track as an information pit row which can be detected optically. To reproduce information recorded on a recording medium, an information pit row on an information track is scanned with an optical beam having a constant power which does not cause recording on the medium, and the light reflected from or passing through the medium is detected.

FIG. 1 is a block diagram illustrating an outlined configuration of a typical optical information recording and reproducing apparatus which employs the information recording and reproducing method described above.

In FIG. 1, the optical information recording and reproducing apparatus comprises a semiconductor laser 101; a collimator lens 102, a diffraction grating 103, a polarized-beam splitter 104, a quarter-wavelength plate 105, and an objective lens 106 placed in that order in the direction in which the light flux emitted from the semiconductor laser 101 advances; and a toric lens 108 and an optical detector 109 placed in that order in the direction in which the light flux separated by the polarized-beam splitter 104 advances. An optical card 107 is placed at the focus of the objective lens 106.

In the above-described optical information recording and reproducing apparatus, the light flux (S polarized light) emitted from the semiconductor laser 101 is made parallel by the collimator lens 102, and then divided into a plurality of light flux by the diffraction grating 103. The divided light flux is converged on the optical card 107 through the polarized-beam splitter 104, the quarter-wavelength plate 105, and the objective lens 106.

The light reflected from the optical card 107 passes through the objective lens 106 and the quarter-wavelength plate 105, and is made to P polarized light. The light is reflected by the polarized-beam splitter 104, and enters the optical detector 109 through the toric lens 108.

Among light flux divided by the diffraction grating 103, the 0th-order diffraction light ray is used to record and reproduce information and to perform automatic focusing control (hereinafter called AF). Automatic tracking control (hereinafter called AT) is performed with the positive and negative first-order diffraction light rays. The astigmatism method is employed for AF and the three-beam method is used for AT.

FIG. 2A and FIG. 2B illustrate a recording surface of an optical card and the relationship between the recording surface and the scanning speed of an optical spot scanning on the optical card. FIG. 2A is an outlined plan of the optical card. FIG. 2B shows a condition that the scanning speed is not constant at both edges of the optical card.

As shown in FIG. 2A, many information recording and reproducing tracks are arranged in parallel on the optical card 107. Part of the tracks, T1, T2, and T3, are illustrated on the figure. These tracks T1, T2, and T3 are partitioned by tracking tracks tt1 to tt4. The tracking tracks tt1 to tt4 are grooves, or formed with a material having a different reflectance from that of the tracks T1 to T3. The tracking tracks are used as guides for getting a tracking signal.

FIG. 2A shows an example in which information is recorded in or reproduced from the track T3. The 0th-order light ray 110 for recording, reproduction, and AF is emitted to the track T3, and the positive and negative first-order light rays 111 and 112 are emitted to the tracking track tt3 and tt4, respectively. From the reflection light of the positive and negative first-order light rays 111 and 112, a tracking signal, described later, is obtained in order to control the 0th-order diffraction light ray 110 such that it scans exactly on the track T3. The diffraction light rays 110, 111, and 112 scan on the optical card 107 right and left on the figure with a not-shown mechanism with the same positional relationship being maintained.

There are two scanning methods, in which an optical system or an optical card is moved. In either method, since the optical system and optical card reciprocate each other, the scanning speed is not constant at both edges of the optical card. FIG. 2B shows this condition. The horizontal axis shown in FIG. 2B indicates the right and left direction of the optical card and the vertical axis indicates the scanning speed. Usually, the constant-speed scan area, located at the center of the optical card 107, is used for a record area.

The format of an information recording and reproducing track of the optical card 107 will be described next.

FIG. 3A is an example illustrating the format of an information recording and reproducing track of an optical card. On an information recording and reproducing track TN, n data blocks (sectors) are recorded or pre-formatted. FIG. 3B is a view illustrating an example of the format of a data block shown in FIG. 3A.

In FIG. 3A and FIG. 3B, a forward phase-locked-loop synchronizing signal 200 is a continuous repeated data pattern recorded at the top of a data block. By synchronizing this forward PLL synchronizing signal 200 with a sampling clock generated by the PLL control signal generator, data preceded by the forward PLL synchronizing signal 200 is surely reproduced.

A data-read-start-position synchronizing signal 201 recorded between the forward PLL synchronizing signal 200 and a data section D1 indicates the position where data-section read starts. This data-read-start-position synchronizing signal 201 uses a special pattern which is not used in data sections. The data-read-start-position synchronizing signal 201 is recognized as a data-read-end-position synchronizing signal when data is reproduced backward. In data sections D1 to Dm, user data, an error correcting code (ECC), which is a redundant word for detecting and correcting errors, and other items are recorded.

An inter-data synchronizing signal 202 prevents data errors from spreading substantially if the sampling clock is out of synchronization due to dust or scratches in data sections. A special code pattern similar to that used for the data-read-start-position synchronizing signal 201 is used for the inter-data synchronizing signal 202.

A data-read-end-position synchronizing signal 203 is recorded immediately after the last data section in one data block. A special code pattern similar to that used for the data-read-start-position synchronizing signal 201 is used for the data-read-end-position synchronizing signal 203. This data-read-end-position synchronizing signal 203 is recognized as the data-read-start-position signal when the optical beam scans backward.

A backward PLL synchronizing signal 204 is a continuous repeated-data pattern used for synchronizing with a sampling clock generated by the PLL control signal generator, described later, when information is reproduced backward.

Reproduction of information on an information recording and reproducing track of the optical card 107 configured as described above will be described next.

FIG. 4 is an enlarged view of the track to which the diffraction light rays 110, 111, and 112 are emitted as shown in FIG. 2A.

In FIG. 4, the 0th-order diffraction light ray 110 for recording, reproduction, and AF is located at the center between the positive and negative first-order diffraction light rays 111 and 112 for AT, and moves along the center line of the track T3. Hatched sections 113a, 113b, and 113c indicate positions where data is recorded with the 0th-order diffraction light ray 110, which are called pits. Since the pits 113a, 113b, and 113c have a different reflectance from that of the surrounding section, when a weak light scans along the center of the track T3, the reflected light is modulated with the pits 113a, 113b, and 113c, and the reproduction signal is obtained.

FIG. 5 is a circuit diagram illustrating the detail of the optical detector 109 shown in FIG. 1 and a signal processing circuit.

In FIG. 5, the optical detector 109 comprises six optical sensors, an optical sensor 115, an optical sensor 116, and a four-divided optical sensor 114 including four optical sensors. The signal processing circuit comprises a differential circuit 119 which receives the outputs of the optical sensors 115 and 116 and outputs a tracking control signal (At); adding circuits 117 and 118 which receive the outputs of the optical sensors diagonally placed in the four-divided sensor 114, respectively; a differential circuit 120 which receives the outputs of the adding circuits 117 and 118 and outputs a focusing control signal (Af); and a adding circuit 121 which receives the outputs of the adding circuits 117 and 118 and outputs an information reproduction signal (RF).

Optical spots 110a, 111a, and 112a indicate that the reflection light rays of the diffraction light rays 110, 111, and 112 enter the corresponding sensors at those points. The optical spot 110a is located nearly at the center of the four-divided sensor 114. The optical spots 111a and 112a are on the optical sensors 115 and 116.

The outputs of the sensors located diagonally in the four-divided sensor 114 are added in the adding circuits 117 and 118, respectively. The outputs of the adding circuits 117 and 118 are added in the adding circuit 121, and an information reproduction signal RF is reproduced. This means that the information reproduction signal RF corresponds to the entire optical spot 110a located on the four-divided sensor 114.

The outputs of the adding circuits 117 and 118 are also input to the differential circuit 120, and this differential circuit 120 finds the difference of them to form the focusing control signal Af. That is, the focusing control signal Af is the difference between the sums of the outputs of the sensors diagonally arranged in the four-divided optical sensor 114. Since the astigmatism method is precisely described in books, its description is omitted here.

The difference between the outputs of the optical sensors 115 and 116 is obtained in the differential circuit 119 to form the tracking control signal At. Control is usually performed such that At becomes zero, thereby performing tracking control for scanning along the information track with light. The information reproduction signal RF obtained in this way is converted to the binary signal for recognizing it as digital information, then this binary signal is sampled with a sampling clock synchronized with the binary signal to generate the data signal.

FIG. 6 is a block diagram illustrating an example of a processing section which converts the information reproduction signal RF to the binary signal and synchronizes the binary signal RF with the clock signal.

The processing section shown in FIG. 6 comprises a comparator 122 which receives the information reproduction signal RF output from the adding circuit 121 shown in FIG. 5 and a reference voltage ref1, and outputs a binary reproduction signal RF2; a PLL control signal generator connected in parallel to the output line of the comparator 122; and a D flip-flop 123 which receives the output of the comparator 122 and a sampling clock SC generated by the PLL control signal generator and outputs the data signal by sampling the binary reproduction signal RF2 with the sampling clock SC.

The information reproduction signal RF output from the adding circuit 121 shown in FIG. 5 is input to the inverting input terminal of the comparator 122 shown in FIG. 6, and compared with the reference voltage ref1 input to the other input terminal of the comparator 122 to form the binary reproduction signal RF2. The binary reproduction signal RF2 generated by this comparator 122 is input to the D flip-flop 123 and the input terminal R of a phase comparator 124.

The reproduction signal RF2 generated by the comparator 122 is input to the D terminal of the D flip-flop 123 and, in order to cope with fluctuation in the scanning speed of the optical spot, is sampled with the sampling clock SC which is almost synchronized with the binary reproduction signal RF2 and is generated in the PLL control signal generator comprising components 124 to 127, described later, to generate the data signal synchronized with the sampling clock SC.

The data signal generated by the flip-flop 123 is generally controlled by the sampling clock SC and stored in buffer memory. Then, the signal is demodulated by a demodulation circuit not shown in the figure and recognized as digital information (reproduction data).

When the binary reproduction signal RF2 generated by the comparator 122 is input to the input terminal R of the phase comparator 124, the sampling clock SC is almost synchronized with the binary reproduction signal RF2 by the phase comparator 124 in conjunction with a charge pump/loop filter 125, a voltage-controlled oscillator (VCO) 126, and a divider 127. The operations of the phase comparator 124, the charge pump/loop filter 125, the voltage-controlled oscillator (VCO) 126, and the divider 127 will be described below in detail.

FIG. 7 is a circuit diagram illustrating the detailed circuit configuration of the phase comparator 124.

The phase comparator 124 comprises a flip-flop 128, a flip-flop 129, and an AND circuit 130. The clock terminal of the flip-flop 128 is connected to the output line of the comparator 122. The non-inverting output Q of the flip-flop 128 is connected to the data terminal of the flip-flop 129. The inverting output terminal Q' of the flip-flop 129 is connected to the reset terminal R of the flip-flop 128. The clock terminal of the flip-flop 129 is connected to the output line (feedback line for the sampling clock SC) of the divider 127 shown in FIG. 6. The AND circuit 130 receives the feedback signal of the sampling clock SC and the signal output from the non-inverting output terminal Q of the flip-flop 129, and outputs a pulse having a half period of the sampling clock SC.

In the phase comparator 124, the binary reproduction signal RF2 output from the comparator 122 is input to the clock terminal of the D flip-flop 128, and the outputs Q and Q' (Q' is the inverted output of Q) are set high and low, respectively. The non-inverting output Q of the flip-flop 128 is input to the input terminal D of the flip-flop 129, and the sampling clock SC is input to the clock terminal CK of the flip-flop 129. The non-inverting output Q of the flip-flop 128 becomes high, setting the outputs Q and Q' of the flip-flop 129 to high and low, respectively.

The inverting output Q' of the flip-flop 129 is connected to the reset terminal of the flip-flop 128 to reset the flip-flop 128. When the flip-flop 128 is reset, the output Q of the flip-flop 128 becomes low, and the outputs Q and Q' of the flip-flop 129 are inverted to low and high, respectively, at the next sampling clock SC.

As described above, in the phase comparator 124, the flip-flop 128 outputs a phase difference (time difference) pulse from the rising edge of the binary reproduction signal RF2 to the rising edge of the sampling clock SC, and the flip-flop 129 outputs a pulse as wide as one period of the sampling clock SC after the binary reproduction signal RF2 goes high. The pulse of one period and the sampling clock SC are gated by the AND gate 130, outputting the pulse D having a half period.

The details will be described later. When the phase of the binary reproduction signal RF2 matches that of the sampling clock SC, the output pulse of the flip-flop 128 has a width half that of the sampling clock SC. When the phase of the sampling clock SC lags against that of the binary reproduction signal RF2, the width of the pulse becomes larger than half of the period of the sampling clock SC, and when the phase of the sampling clock leads, the width of the pulse becomes smaller than half of the period of the sampling clock SC.

Therefore, in the processing section shown in FIG. 6, the output U or U' (U' is the inverted output of U) of the flip-flop 128, which is a phase-lag signal, is used to increase the frequency of the sampling clock SC, and the output D of the AND circuit 130, which is a phase-lead signal, is used to reduce the frequency of the sampling clock SC.

In other words, the phase difference of the sampling clock SC against the binary reproduction signal RF2 is indicated by the pulse width of the output U or U' of the flip-flop 128 in the above-described processing section. To detect a phase lag or phase lead, the output D of the AND circuit 130, which is a pulse having the half width of the sampling clock SC, is referenced.

To reproduce information from a medium in which the information is recorded using the length of a pit or the length of the gap between pits as in the above-described example, the period of the sampling clock SC is, off course, set so that it corresponds to the minimum pit length (hereinafter called 1T) or equivalent. If a track to be reproduced includes a pit or a gap between pits which is longer than 1T, the rising edge of the sampling clock SC does not match the rising (or falling) edge of the binary reproduction signal RF2 at that pit or gap. Because of this, the phases cannot be compared at each sampling clock SC.

To solve this problem, in the example shown in FIG. 7, phase comparison with the sampling clock SC is performed only at the rising edge of the binary reproduction signal RF2, not at each sampling clock SC. An SR flip-flop which is set by the binary reproduction signal RF2 and reset by the sampling clock SC is required to implement this comparison. In the above-described processing circuit, the operation of an SR flip-flop is achieved by feeding back the inverting output Q' of the D flip-flop 129 to the reset terminal of the flip-flop 128 as shown in FIG. 7.

The operation of the charge pump/loop filter 125 at the timing when the two outputs U' and D of the phase comparator 124 are input to the charge pump/loop filter 125 will be described below in detail.

FIG. 8 is a detailed circuit diagram of the most typical charge pump/loop filter used as the charge pump/loop filter 125.

In FIG. 8, the charge pump/loop filter 125 comprises an amplifier 131, diodes, resistors, and a capacitor. The amplifier 131 receives at the inverting input terminal the output U' of the phase comparator 124 with a backward diode D1 and a resistor R1 inserted in series, connected in parallel with the output D of the phase comparator 124 with a forward diode D2 and a resistor R2 inserted in series. The amplifier 131 also receives the reference voltage ref2 at the other input terminal, and outputs a frequency control signal FC, which is fed back to the inverting input terminal of the amplifier 131 with a resistor R3 and a capacitor C1 being inserted in series to the feedback line.

In the charge pump/loop filter 125, the reference input to the amplifier 131 is the reference voltage ref2. When the two outputs U' and D of the phase comparator 124 are both lower than the reference voltage ref2, a current flows from the output of the amplifier 131 through the capacitor C1, the resistor R3, the resistor R1, and the diode D1, charging the capacitor C1, thereby increasing the output of the amplifier 131. In this case, since the diode D2 is arranged in the direction opposed to that of the current flow, the current does not flow into the input D.

On the contrary, when the two outputs U' and D of the phase comparator 124 are both higher than the reference voltage ref2, a current flows from the input D through the diode D2, the resistor R2, the resistor R3, and the capacitor C1 to the output of the amplifier 131, discharging the capacitor C1, thereby reducing the output of the amplifier 131.

The difference between the amounts of charges with which the capacitor C1 is charged and discharged is proportional to the difference between the pulse widths of the two outputs of the phase comparator 124 when the resistor R1 and the resistor R2 are set such that they have the same resistance. When the outputs U' and D of the phase comparator 124 have the same pulse width, the output FC of the amplifier is constant. When the output U' of the phase comparator 124 has a broader pulse width than the output D, the output FC of the amplifier 131 becomes higher. When the output D of the phase comparator 124 has a broader pulse width, the output FC of the amplifier 131 becomes lower.

The output of the charge pump/loop filter 125 is input to the frequency control terminal FC of the voltage-controlled oscillator 126. One of ICs that can be used for this voltage-controlled oscillator 126 is SN74LS624 (product name) of Texas Instrument, which outputs a signal having a frequency proportional to that of the frequency control input FC within the preset frequency range.

The output of the voltage-controlled oscillator 126 is divided in frequency by a factor of 2 by the divider 127 in order to make the duty ratio 1:1. The resultant signal is the sampling clock SC. The obtained sampling clock SC is fed back to the phase comparator 124, and also used as a clock for sampling the binary reproduction signal RF2 in the flip-flop 123. The sampling clock SC is further used as a control signal for buffer memory control and other purposes.

Therefore, when the pulse width of the output U' of the phase comparator 124 is broader than that of the output D, the frequency of the sampling clock SC becomes higher, and when the pulse width of the output U' is smaller than that of the output D, the frequency of the sampling clock SC becomes lower, in the processing section shown in FIG. 6. When the two outputs U' and D of the phase comparator 124 have the same pulse width, the frequency of the sampling clock does not change.

The process in which the sampling clock SC is synchronized with the binary reproduction signal RF2 will be described below in detail.

FIG. 9A is an outlined view of optical-spot scan on pits. FIG. 9B shows the corresponding reproduction signal, and FIG. 9C shows the corresponding binary reproduction signal. FIGS. 9D, 9E, and 9F illustrate the timing of the signals at the terminals shown in FIGS. 6 and 7. FIG. 9D shows the signal timing for the case in which the phase of the binary reproduction signal RF2 match that of the sampling clock SC. FIG. 9E shows the signal timing for the case in which the phase of the sampling clock lags by 0.25T (25%) against that of the binary reproduction signal RF2. FIG. 9F illustrates the signal timing for the case in which the phase of sampling clock leads by 0.25T (25%) against that of the binary reproduction signal Rf2.

In FIG. 9A, pits 113$d$, 113$e$, and 113$f$ are pits like the pits 113$a$, 113$b$, and 113$c$ shown in FIG. 4, which are optical marks having a lower reflectance than the surroundings. Optical diffraction according to their mechanical shapes, dent or protrusion, may be used for these pits, in addition to the optical density. The pit 113$d$ is a minimum pit having a length of 1T. The pit 113$e$ is twice as wide as the minimum pit, having a length of 2T. The gap between the pits 113$d$ and 113$e$ is a minimum gap, having a length of 1T. The gap between the pits 113$e$ and 113$f$ is twice as wide as the minimum gap, having a length of 2T. This example shows a case in which pit lengths and gap lengths conform to the standard.

When the optical spot moves relative to the recording medium such that the optical spot 110 passes through the pits 113$d$, 113$e$, and 113$f$ shown in FIG. 9A in the direction indicated by an arrow, as shown in FIG. 4, the RF signal shown in FIG. 9$b$ is obtained due to a low optical reflectance at the pits. This obtained RF signal is input to the comparator 122 shown in FIG. 6 in order to get the inverted binary reproduction signal RF2 shown in FIG. 9C.

In the case shown in FIG. 9D, the output U of the flip-flop 128 and the output D of the AND circuit 130 have a width of 0.5T, which is half the time (1T) required for scanning the minimum pit length. The rising edge of the sampling clock SC, which is the sampling point in sampling the binary reproduction signal RF2, is located at the center of 1T in each pit or each pit gap, leaving the maximum margin for fluctuation in the scanning speed of the optical spot.

In the case illustrated in FIG. 9E, since the pulse width of the output U of the flip-flop 128 is larger than that of the output D of the AND circuit 130 by 0.25T, the frequency of the sampling clock SC increases so that the sampling clock SC catches up with the binary reproduction signal RF2.

In the case illustrated in FIG. 9F, since the pulse width of the output U of the flip-flop 128 is smaller than that of the output D of the AND circuit 130 by 0.25T, the frequency of the sampling clock SC decreases so that the sampling clock SC shifts backward to match the binary reproduction signal RF2.

In the examples shown in FIGS. 9D, 9E, and 9F, the pit length and pit-gap length conform to the standard. This means that the margin is 0.5T (50%). If the phase of the sampling clock SC shifts by 0.25T (25%) against that of the binary reproduction signal RF2 as shown in FIGS. 9E and 9F, data can be reproduced correctly as 1T, 1T, 2T, and 2T.

In reproducing a signal, when the PLL synchronizing signal starts being input, the sampling clock SC is quickly synchronized with the binary reproduction signal RF2, and RF-signal jitter caused by fluctuation in the scanning speed of the optical spot is followed, as described above. In this process, however, the time constant $\tau$ of the charge pump/loop filter could not be changed according to conditions, in the conventional system, causing the following problems.

The problems will be described by referring to FIG. 10, which is a graph illustrating a synchronization process in which the sampling clock SC synchronizes with the reproduction signal with different time constants. In FIG. 10, two curves are shown, curve X with a small time constant $\tau$ of the charge pump/loop filter, and curve Y with a large time constant $\tau$. The vertical axis indicates the frequency, the horizontal axis indicates the time required for synchronization, point B indicates the point where the sampling clock SC synchronizes with the binary reproduction signal on the curve X, and point C is the point where the sampling clock SC synchronizes with the binary reproduction signal on the curve Y.

As indicated by the curve X in FIG. 10, when the frequency band in which the operation of the PLL control signal generator is ensured is set to a broad band, that is, the time constant $\tau$ of the charge pump/loop filter is set small, the response becomes faster, and the sampling clock SC synchronizes with the binary reproduction signal RF2 at the point B where the PLL synchronizing signal is still being input. However, if the reproduction signal is lost due to dust, scratches, or defects on the recording medium, synchronization miss easily occurs, and data cannot be correctly read.

On the other hand, as indicated by the curve Y in FIG. 10, when the frequency band in which the operation of the PLL control signal generator is ensured is set to a narrow band, that is, the time constant $\tau$ of the charge pump/loop filter is set large, the response becomes slower, and synchronization miss does not occur easily if the reproduction signal is lost due to dust, scratches, or defects on the recording medium during the synchronization process. However, the sampling clock SC cannot be synchronized with the binary reproduction signal RF2 while the PLL synchronizing signal 200 is being input. Therefore, if the synchronization is achieved at point C after the PLL synchronizing signal 200, for example, the data-read-start-position synchronizing signal 201 cannot be detected. In addition, RF-signal jitter caused by fluctuation in the scanning speed of the optical spot cannot be followed, disabling the data to be read correctly after all.

SUMMARY OF THE INVENTION

Accordingly, it is an object of the present invention to solve the above-described problems of the conventional technique, and to provide an optical information reproduction apparatus which enables reliable information reproduction.

The above objects of the present invention are achieved through the provision of an optical information reproduction apparatus comprising means for scanning with an optical beam an optical information recording medium in which information is recorded; means for generating a reproduction signal from the optical beam modulated according to the information; means for converting the reproduction signal to the binary signal; sampling-clock generating means for generating a sampling clock synchronized with the binary reproduction signal; means for reproducing the information by sampling the binary reproduction signal with the sampling clock; and means for switching the response of the sampling-clock generating means.

The foregoing objects of the present invention are also achieved by the provision of another optical information reproduction apparatus, an embodiment of the present invention, comprising means for scanning with an optical beam an optical information recording medium in which information is recorded; an optical detector for receiving the optical beam modulated according to the information and for outputting a reproduction signal; a binary-conversion circuit for converting the reproduction signal to the binary signal; a phase-locked-loop control signal generator for generating a sampling clock synchronized with the binary reproduction signal, the phase-locked-loop control signal generator having a frequency band in which the operation thereof is ensured; an information reproduction circuit for reproducing the information by sampling the binary reproduction signal with the sampling clock; and a circuit for switching the frequency band in which the operation of the phase-locked-loop control signal generator is ensured.

Since the frequency band in which the operation of the PLL control signal generator is ensured cannot be switched in the conventional optical information reproduction apparatus, the frequency band of the PLL control signal generator is the same in reproducing a data section and in synchronizing the binary reproduction signal with the sampling clock.

On the contrary, in the optical information reproduction apparatus of the present invention, which is configured as described above, the frequency band in which the operation of the PLL control signal generator is ensured, which determines the response of the PLL control signal generator, can be switched between a narrow or broad band by a switching means. The frequency band of the PLL control signal generator can be set to a broad band to make the response fast in synchronizing the sampling clock with the binary reproduction signal. In reproducing a data section, the frequency band of the PLL control signal generator can be set to a narrow band to make the response slow.

Therefore, unlike the conventional optical information reproduction apparatus, the optical information reproduction apparatus of the present invention allows the synchronization of the sampling clock SC with the binary reproduction signal RF2 while the PLL synchronizing signal is being input, and also allows RF-signal jitter caused by fluctuation in the scanning speed of the optical spot to be followed. In addition, if a reproduction signal is lost due to dust, scratches, or defects on a recording medium in reproducing a data section, synchronization miss does not occur.

When an optical information reproduction apparatus according to the present invention has a PLL control signal generator comprising a phase comparator which generates a phase-lag signal and a phase-lead signal from the phases of a binary reproduction signal and sampling clock; a low-pass filter which outputs a voltage according to the pulse widths of the phase-lag signal and the phase-lead signal both generated in the phase comparator; and a voltage-controlled oscillator which changes the frequency and phase of the sampling clock according to the output of the low-pass filter, the time constant of the low-pass filter can be switched by a switching means, thereby the frequency band of the PLL control signal generator is switched.

DETAILED DESCRIPTION OF THE PREFERRED EMBODIMENTS

Embodiments of the present invention will be described below in detail by referring to drawings.

Figure 11:
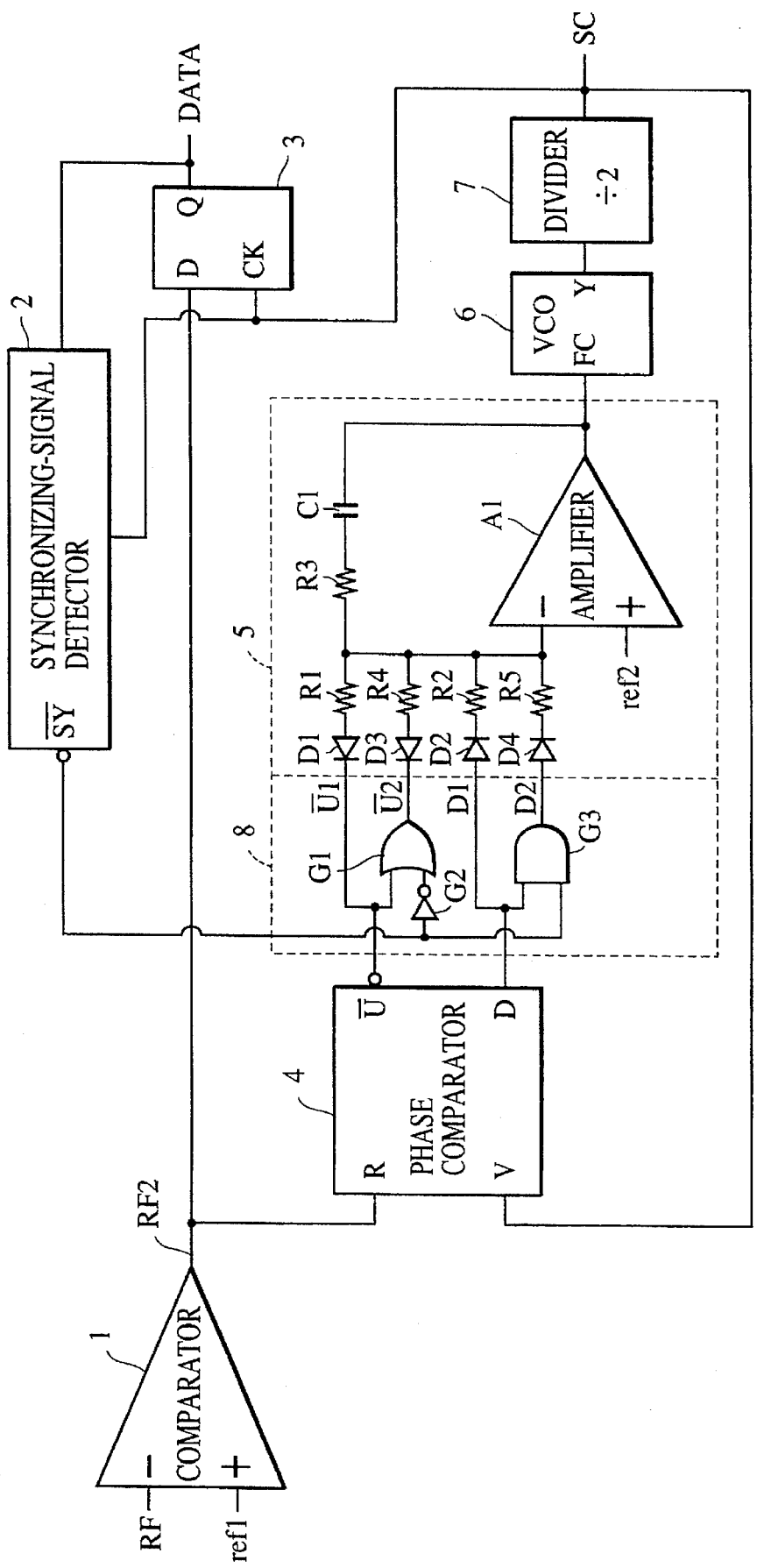
FIG. 11 is a block diagram illustrating an outlined configuration of a reproduction-signal processing system, which is a main section of an optical information reproduction apparatus according to a first embodiment of the present invention.

FIG. 11 is a block diagram illustrating an outlined configuration of a reproduction-signal processing system, which is a main section of an optical information reproduction apparatus according to a first embodiment of the present invention.

Figure 1:
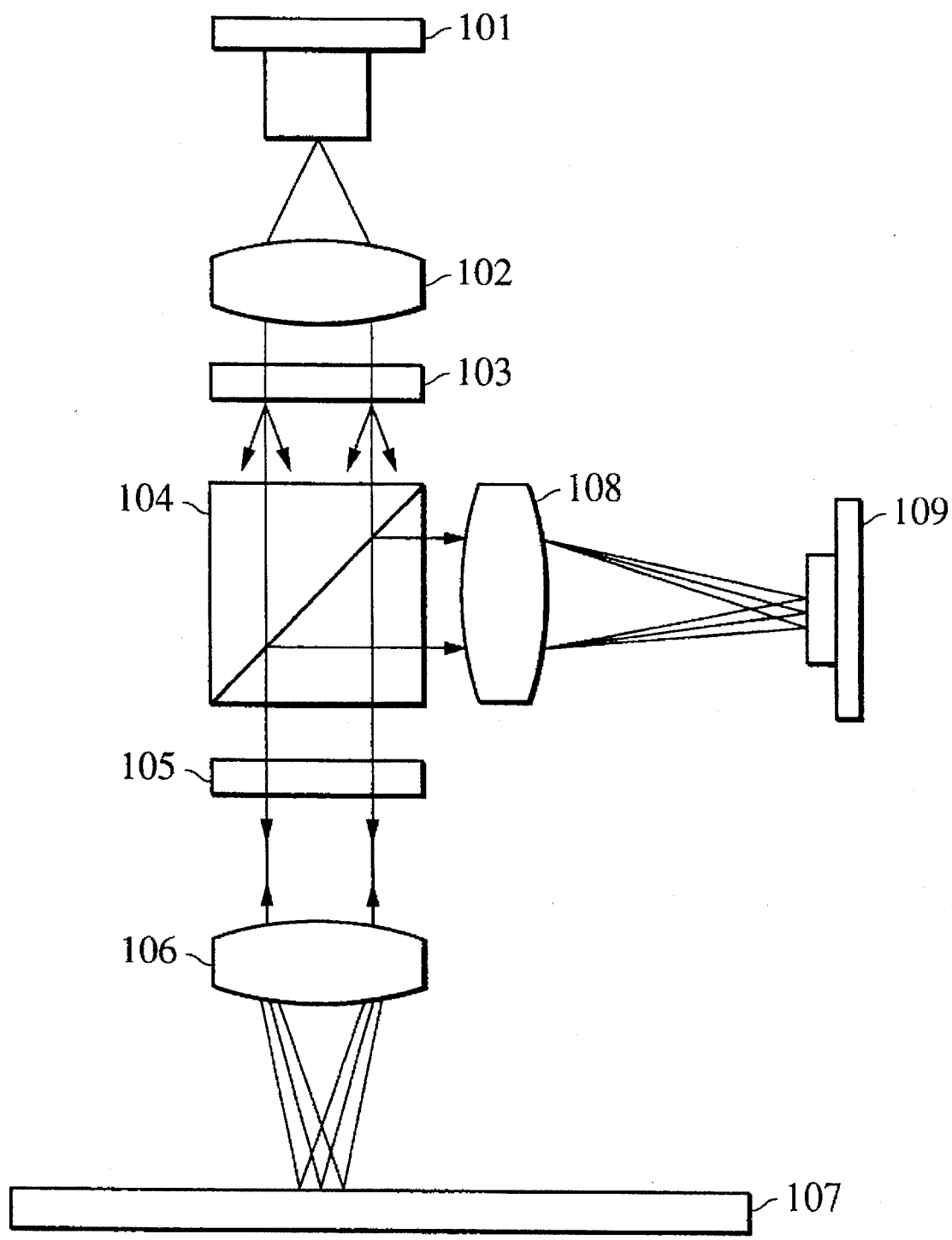
FIG. 1 is a block diagram illustrating the configuration of an optical information recording and reproducing apparatus.
Figure 2A:
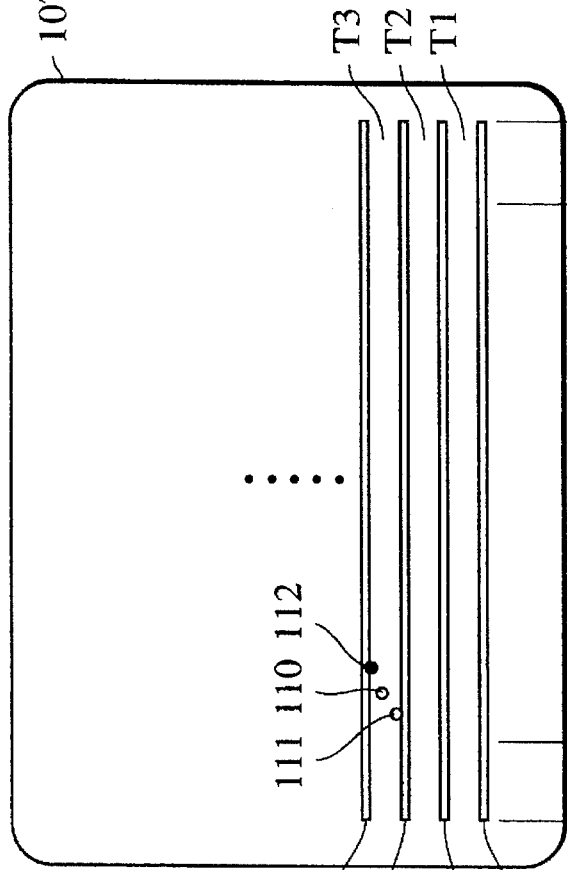
FIG. 2A and FIG. 2B are an outlined plan of a recording surface of an optical card and a graph indicating the scan speed of an optical spot scanning the recording surface, respectively.
Figure 2B:
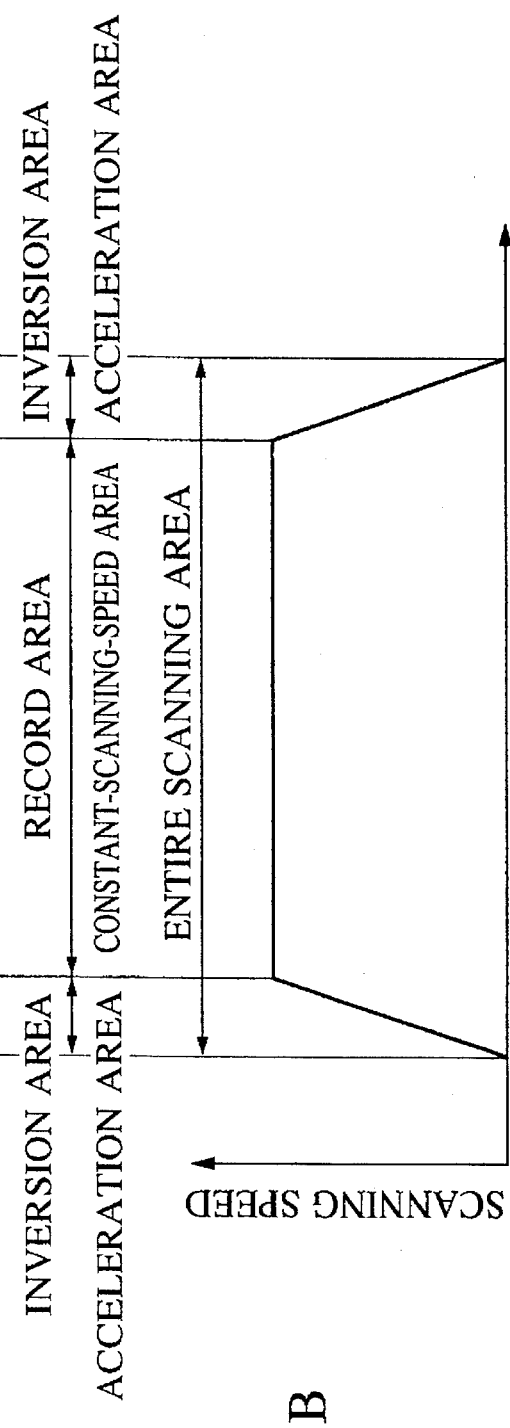
Figure 3A:
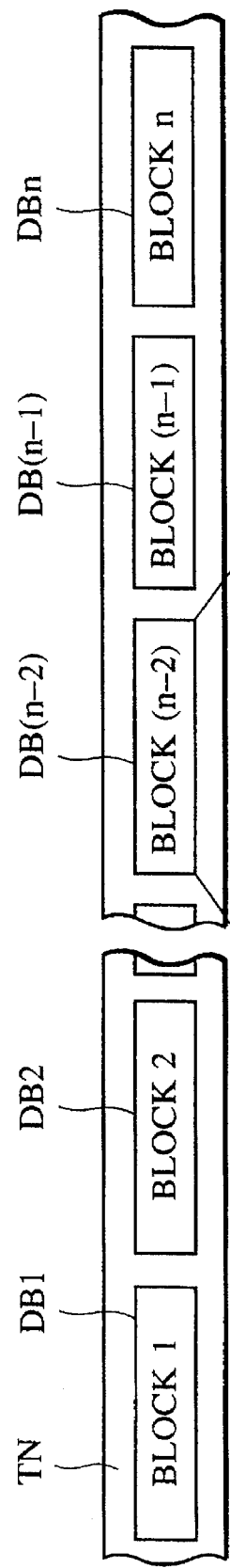
FIG. 3A and FIG. 3B are views illustrating an example of the data format of an optical card.
Figure 3B:
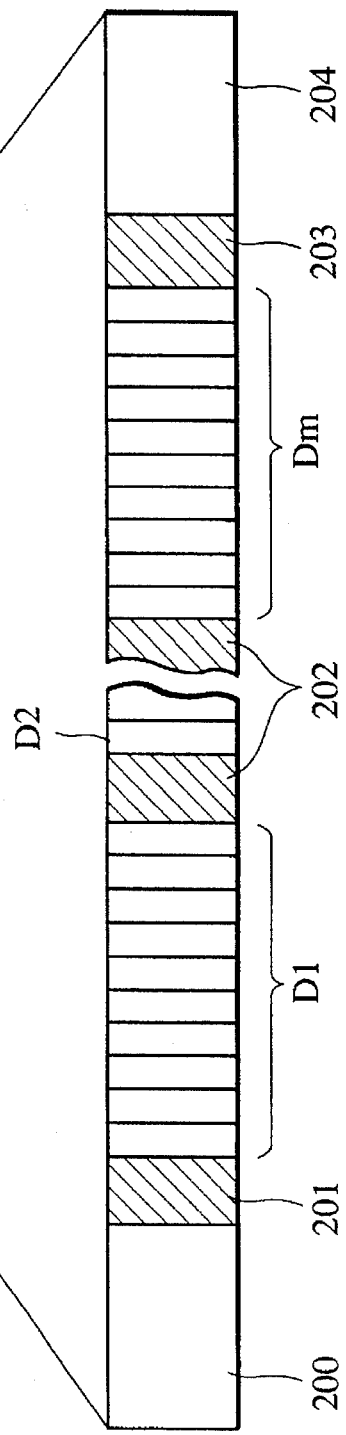
Figure 4:
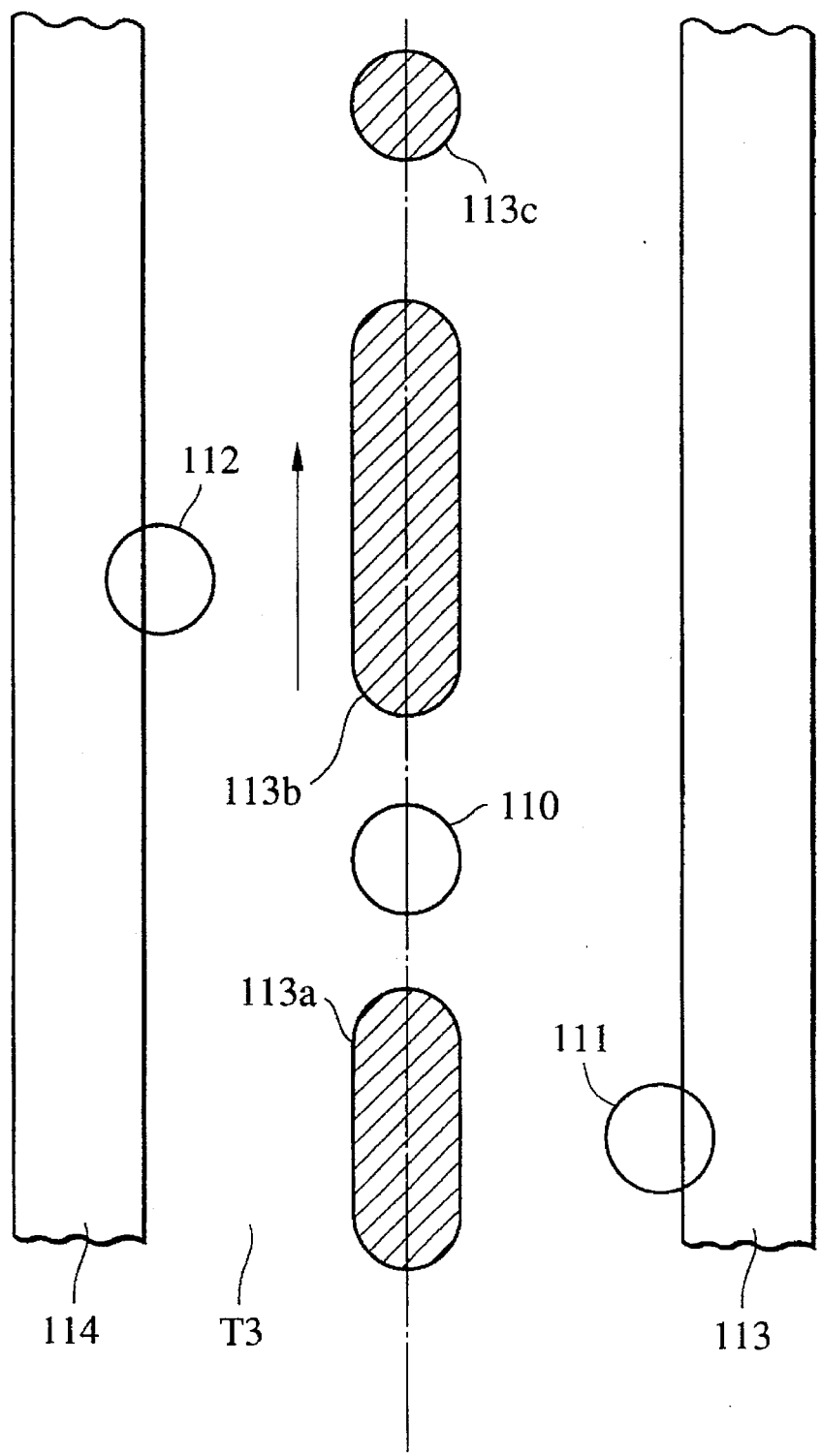
FIG. 4 is an outlined view illustrating the relationship between a track and optical spots on an optical card.
Figure 5:
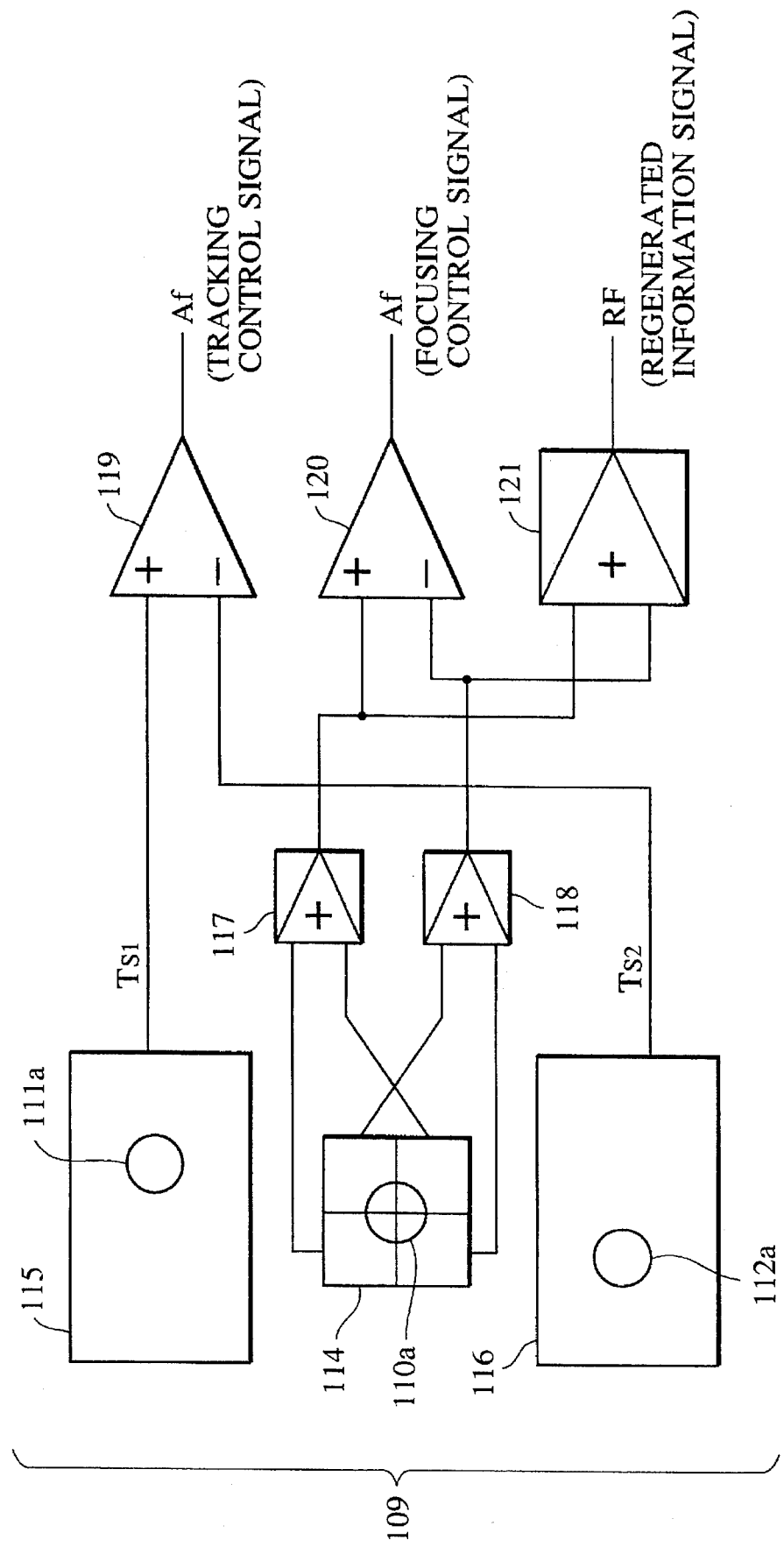
FIG. 5 is a block diagram of the optical detector and the signal processing circuit both shown in FIG. 1.
Figure 6:
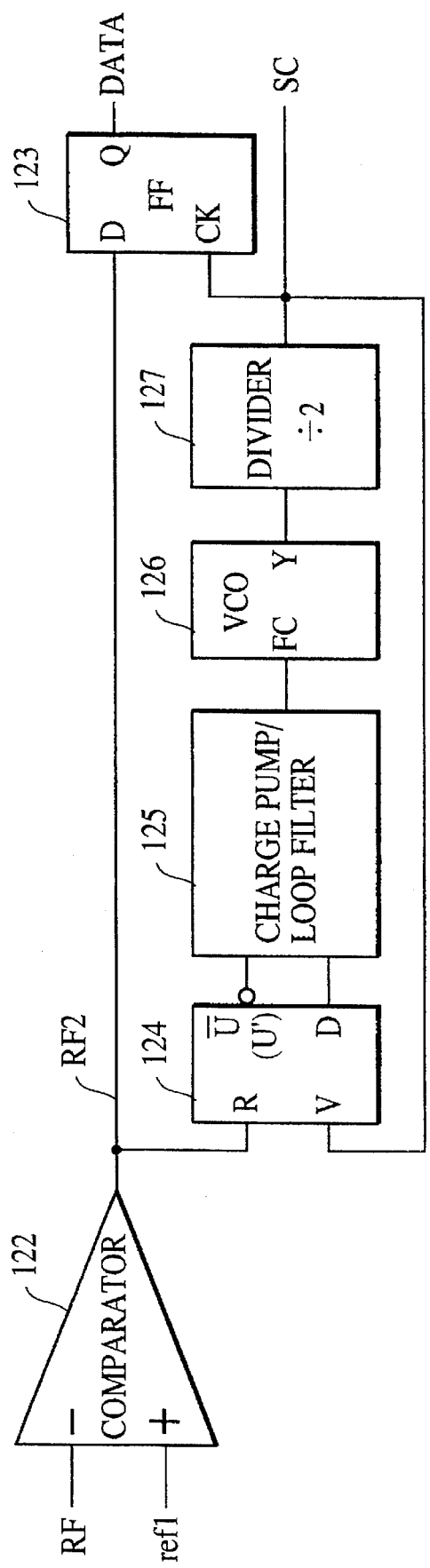
FIG. 6 is a block diagram illustrating an example of a processing circuit which converts a reproduction signal to the binary signal and synchronizes the binary signal with the clock signal.

In this embodiment, sections other than the reproduction-signal processing system may be configured, for example, as shown in FIG. 1 and FIG. 5. An optical card illustrated in FIG. 2A, 2B, 3A, and 3B may be used as an optical information recording medium employed in this embodiment.

The reproduction-signal processing system of the optical information reproduction apparatus according to this embodiment is arranged such that two different time constant $\tau$'s can be set for a charge pump/loop filter, and a time constant $\tau$ can be switched until a synchronizing-signal detector detects a data-read-start-position synchronizing signal and within a period from the time a synchronizing-signal detector 2 detects a data-read-start-position synchronizing signal to the time the relevant information is reproduced. This processing system comprises the synchronizing-signal detector 2; a D flip-flop 3; and a PLL control signal generator including a comparator 1, a phase comparator 4, time-constant switcher 8, a charge pump/loop filter 5, a voltage-controlled oscillator 6, and divider 7. Each section will be described below.

The comparator 1 receives a reference voltage ref1 and the output of an optical detector (not shown in the figure), that is a reproduction signal RF read from an optical information recording medium, such as an optical card and an optical disk. The comparator 1 compares these inputs and outputs the binary reproduction signal RF2, which is converted from the reproduction signal RF.

The synchronizing-signal detector 2 is connected to the output (sampling clock SC) line of the PLL control signal generator and the output (data signal) line of the D flip-flop 3, described later. The synchronizing-signal detector 2 detects a data-read-start-position synchronizing signal using a data signal sampled from the binary reproduction signal RF2 with the sampling clock SC synchronized with the binary reproduction signal RF2. The synchronizing-signal detector 2 outputs a high-level synchronizing-signal detection signal to the time-constant switcher 8, described later, until it detects a data-read-start-position synchronizing signal. When the synchronizing-signal detector 2 detects a data-read-start-position synchronizing signal, it changes the synchronizing-signal detection signal to the low level. If the synchronizing-signal detector 2 detects a data-read-start-position synchronizing signal when the synchronizing-signal detection signal is low, the detector 2 changes the signal to the high level.

In the D flip-flop 3, an input terminal D is connected to the output line of the comparator 1, and a clock terminal CK is connected to the output line of the PLL control signal generator. When the sampling clock SC output from the PLL control signal generator is applied to the D flip-flop 3, the D flip-flop 3 samples the binary reproduction signal RF2 output from the comparator 1 with this sampling clock SC, then generates the data signal synchronized with the sampling clock SC.

Figure 7:
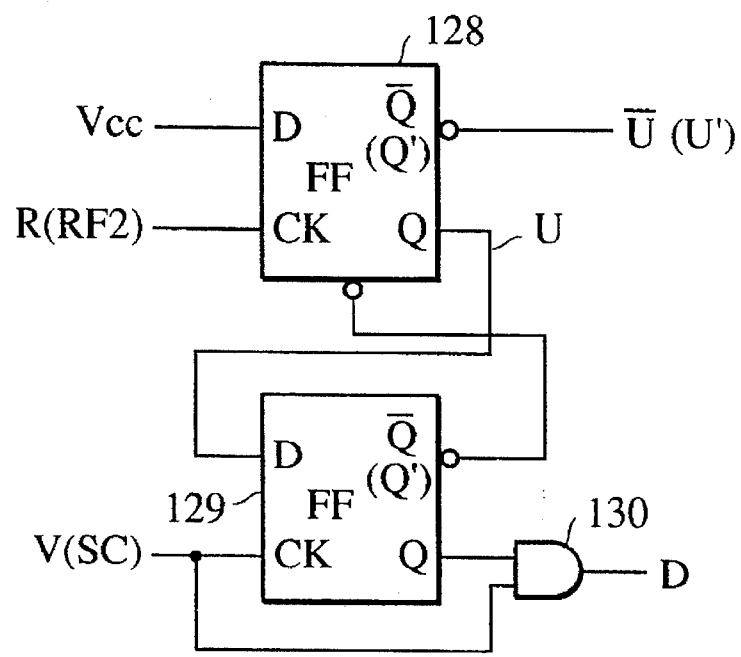
FIG. 7 is a block diagram illustrating an example of a phase comparator.
Figure 8:
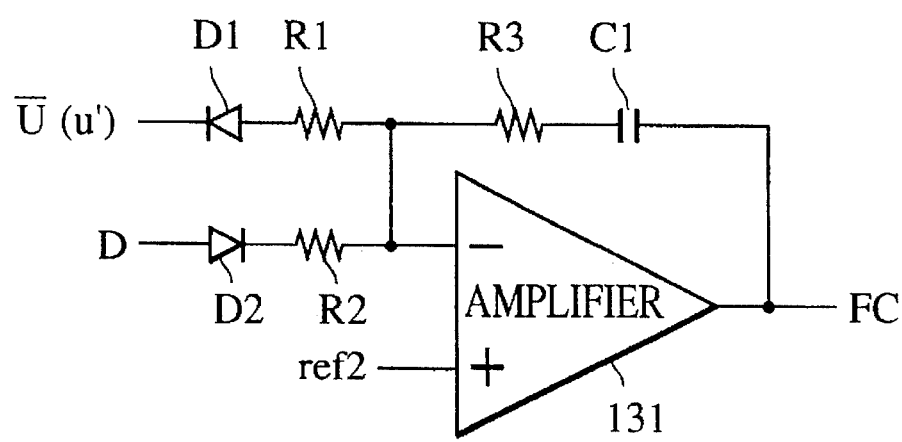
FIG. 8 is a block diagram illustrating an example of a charge pump/loop filter circuit.
Figure 9:
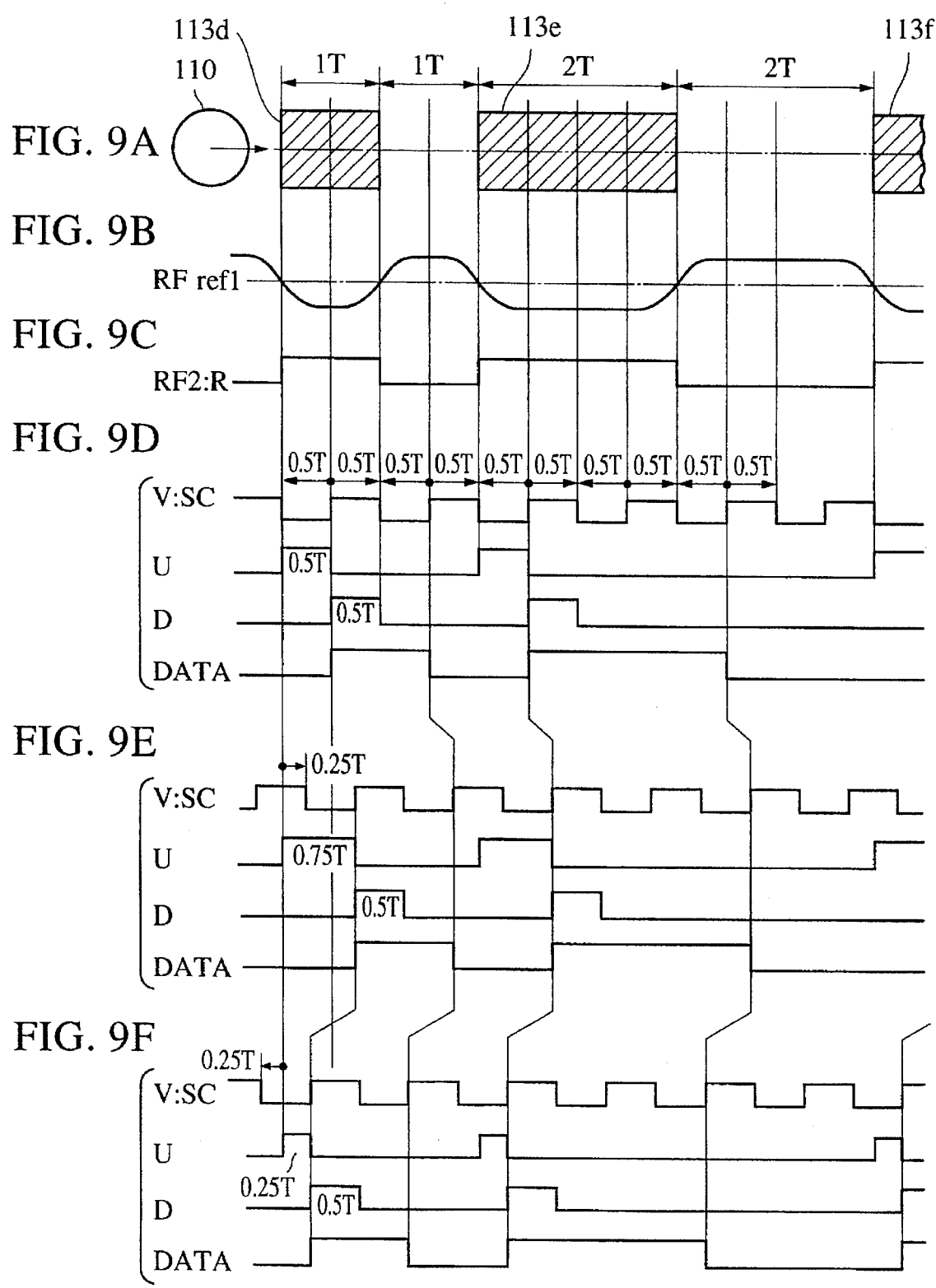
FIG. 9A through FIG. 9F are an outlined view of optical-spot scan on pits and timing charts indicating the timing of the signals at the terminals of the circuits shown in FIG. 6 and FIG. 7.
Figure 10:
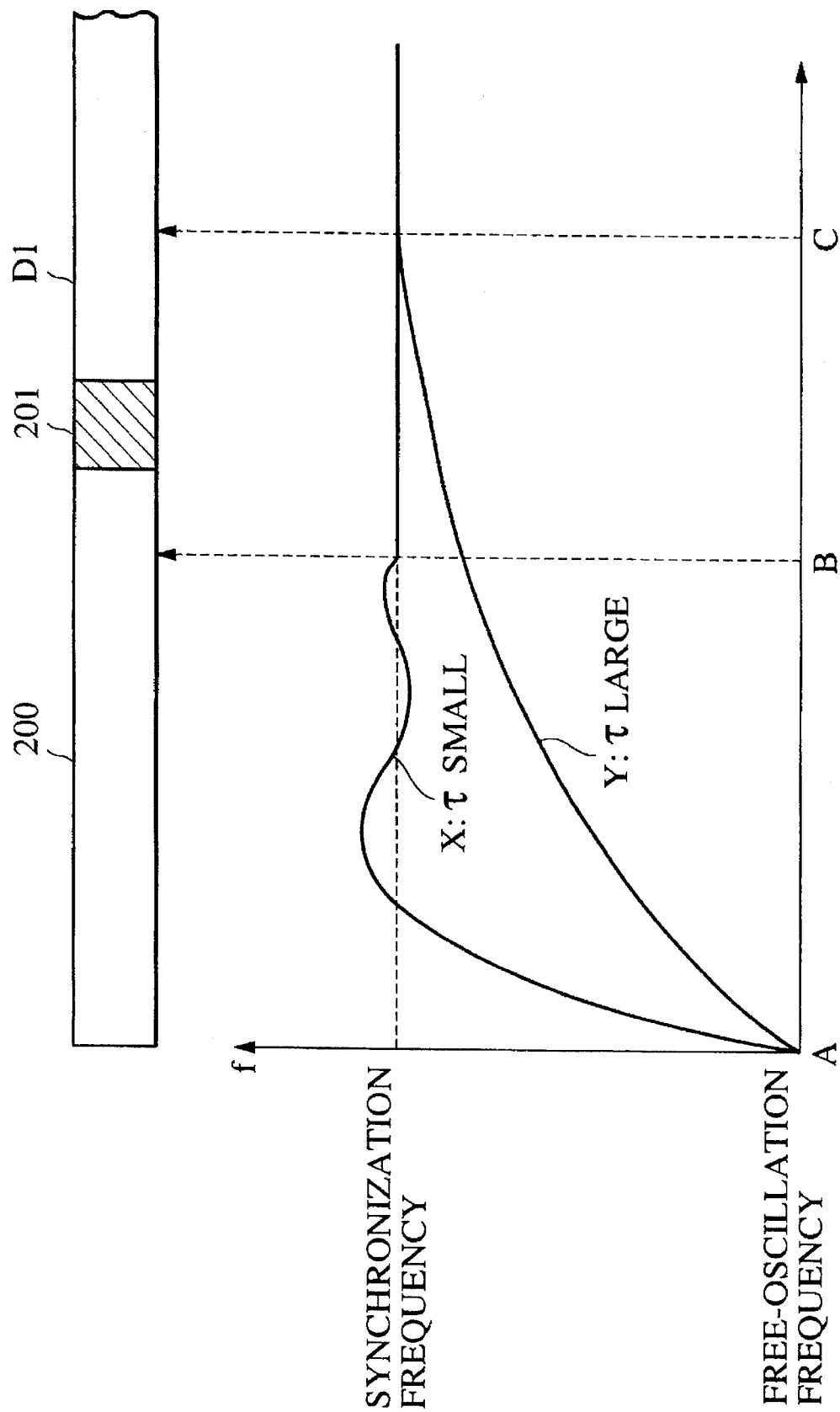
FIG. 10 is a graph illustrating changes in frequency for the case in which the sampling clock follows the reproduction-signal jitter.

The phase comparator 4 forms a feedback line for the sampling clock SC with its one input terminal R being connected to the output line of the comparator 1 and the other input terminal V being connected to the output line of the PLL control signal generator. The phase comparator outputs an inverted phase-lag signal (signal used for increasing the frequency of the sampling clock SC) from an inverting output terminal $\overline{U}$, and outputs a phase-lead signal (signal used for reducing the frequency of the sampling clock SC) from the other output terminal D. A phase detector similar to that shown in FIG. 7 is used.

The time-constant switcher 8 switches the time constant $\tau$ of the charge pump/loop filter 5, described later. The switcher 8 comprises an OR gate G1, a NOT gate G2, and an AND gate G3. One input of the OR gate G1 is connected to the output line of the output terminal $\overline{U}$ of the phase comparator 4, and the other input is connected to the output line of the synchronizing-signal detector 2 through the NOT gate G2. One input of the AND gate G3 is connected to the output line of the output terminal D of the phase comparator 4, and the other input is connected to the output line of the synchronizing-signal detector 2.

The charge pump/loop filter 5 comprises an amplifier A1, diodes, resistors, and a capacitor. Connected in parallel to the inverting input terminal of the amplifier A1 are the output line of the inverting output terminal $\overline{U}$ of the phase comparator 4 with a diode D1 and a resistor R1 being connected in series; the output line of the output terminal D of the phase comparator 4 with a diode D2 and a resistor R2 being connected in series; the output line of the OR gate G1 with a diode D3 and a resistor R4 being connected in series; and the output line of the AND gate G3 with a diode D4 and a resistor R5 being connected in series. The other input terminal of the amplifier A1 is connected to a reference voltage ref2. The output of this amplifier A1 is input to the voltage-controlled oscillator 6, described later, and fed back to the above-described inverting input terminal. In this feedback line, a resistor R3 and a capacitor C1 are inserted in series.

The voltage-controlled oscillator 6 receives the output of the charge pump/loop filter 5, oscillates at a frequency four times as high as that of the binary reproduction signal RF2, and outputs a signal having that frequency to the divider 7, described later.

The divider 7 receives the output of the voltage-controlled oscillator 6, and outputs a sampling clock SC having a frequency twice as high as that of the binary reproduction signal RF2 having a duty ratio of 1:1. The output of the divider 7 is fed back to the V terminal of the phase comparator 4 and is also input to the clock terminal of the D flip-flop 3 in order to generate a data signal synchronized with the sampling clock SC.

In the optical information reproduction apparatus of the present embodiment, since the time-constant switcher 8 sets the time constant $\tau$ of the charge pump/loop filter 5 to a smaller one until the synchronizing-signal detector 2 detects a data-read-start-position synchronizing signal, the response becomes fast and the sampling clock SC can be synchronized with the binary reproduction signal RF2 while the PLL synchronizing signal is being input. On the contrary, since the time-constant switcher 8 sets the time constant τ of the charge pump/loop filter 5 to a larger one after the synchronizing-signal detector 2 detects the data-read-start-position synchronizing signal, the response becomes slow and synchronization can be easily maintained even if a reproduction signal is lost due to dust, scratches or defects during synchronization.

The operation of the above-described optical information reproduction apparatus will be described next.

Figure 12:
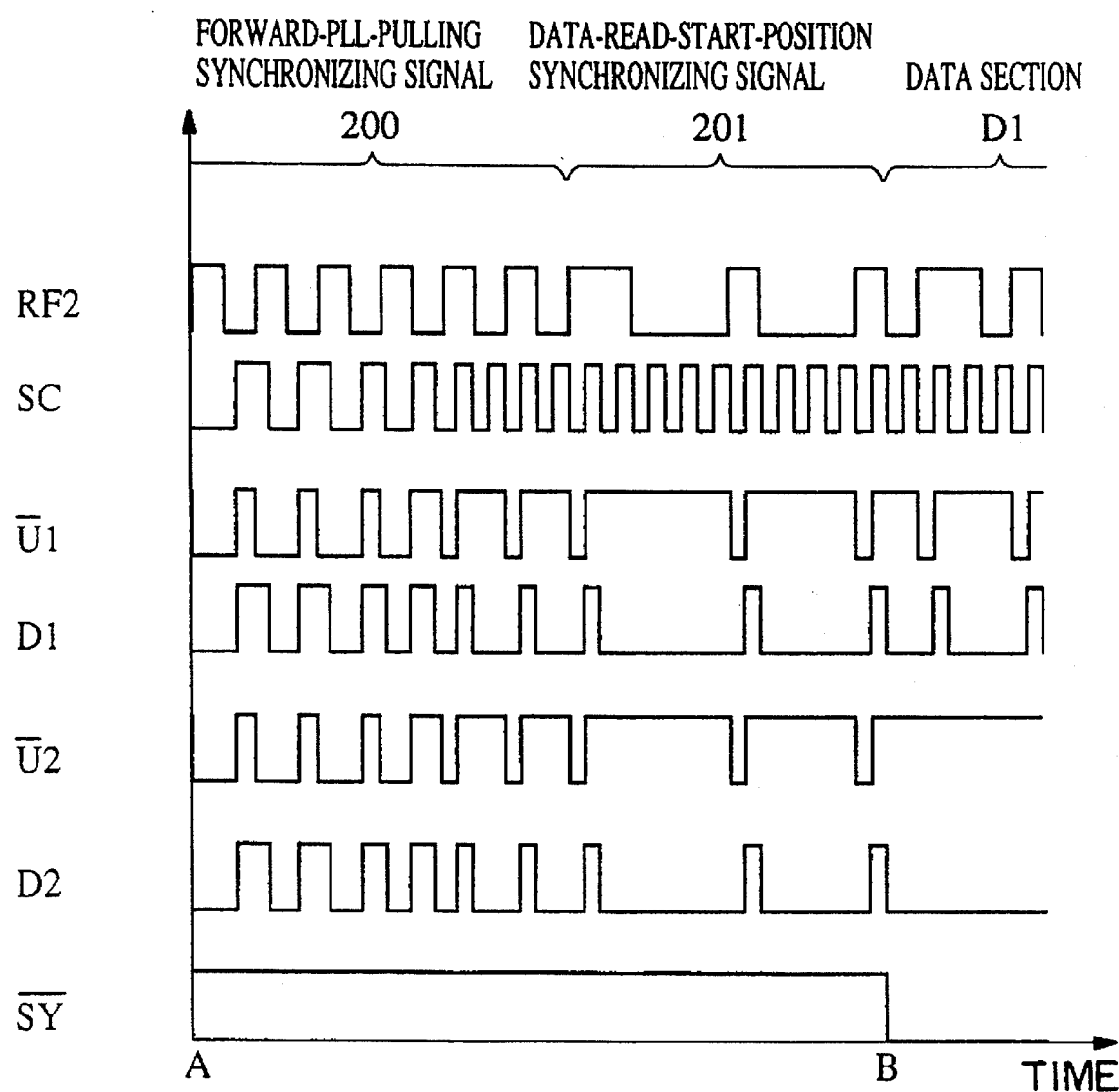
FIG. 12 is a timing chart of the output signal of each section in the signal processing system shown in FIG. 11.

FIG. 12 is a timing chart showing the output of each section of the above-described optical information reproduction apparatus.

In FIG. 12, there are shown the binary reproduction signal RF2 output from the comparator 1, the sampling clock SC output from the voltage-controlled oscillator 6, the phase-lag signal $\overline{U1}$ output from the inverting output terminal $\overline{U}$ of the phase comparator 4, the phase-lead signal D1 output from the output terminal D of the phase comparator 4, the output signal $\overline{U2}$ of the OR gate G1 in the time-constant switcher 8, the output signal D2 of the AND gate G3 in the time-constant switcher 8, and the output signal $\overline{SY}$ of the synchronizing-signal detector 2.

In the optical information reproduction apparatus of the present embodiment, the output signal $\overline{SY}$ of the synchronizing-signal detector 2 is kept high until the synchronizing-signal detector 2 detects a data-read-start-position synchronizing signal 201 in reproduction data, as shown in FIG. 12. While the output signal $\overline{SY}$ of the synchronizing-signal detector 2 is being maintained high, since the OR gate G1 and the AND gate G3 in the time-constant switcher 8 pass input signals to their output terminals as is, the output signal $\overline{U2}$ of the OR gate G1 is the same as the phase-lag signal $\overline{U1}$ of the phase comparator 4, and the output signal D2 of the AND gate G3 is the same as the phase-lead signal D1 of the phase comparator 4. In such a case, when both phase-lag signal $\overline{U1}$ and phase-lead signal D1 of the phase comparator 4 become lower than the reference voltage ref2, a current flows from the output of the amplifier A1 through the capacitor C1 and the resistor R3 to both the resistor R1 and the diode D1, and the resistor R4 and the diode D3, charging the capacitor C1 to increase the output of the amplifier A1. In this case, the time constant $\tau_V$ of the charge pump/loop filter 5 is as follows:

$$\tau_V = R1 \times R4 \div (R1+R4) \times C1$$

The current does not flow toward the output terminal D of the phase comparator 4 because the diodes D2 and D4 are arranged in the opposite direction. Contrary to the above-described case, when all of the phase-lag signal $\overline{U1}$ of the phase comparator 4, the output signal $\overline{U2}$ of the OR gate G1, the phase-lead signal D1 of the phase comparator 4, and the output signal D2 of the AND gate G3 become higher than the reference voltage ref2, a current flows from the output terminal D of the phase comparator 4 through both the diode D2 and the resistor R2, and the diode D4 and the resistor R5, to the resistor R3, the capacitor C1, and the output of the amplifier A1, discharging the capacitor C1 to reduce the output of the amplifier A1. In this case, the time constant $\tau_D$ of the charge pump/loop filter 5 is as follows:

$$\tau_D = R2 \times R5 \div (R2+R5) \times C1$$

Therefore, in the optical information reproduction apparatus of the present embodiment, when the resistor R1 and the resistor R4 have the same resistance as the resistor R2 and the resistor R5, respectively, the difference between the amounts of charges with which the capacitor C1 is charged and discharged is proportional to the difference between the pulse width of the signal output from the inverting output terminal $\overline{U}$ of the phase comparator 4 and that of the signal output from the output terminal D of the phase comparator 4.

In other words, when the pulse widths of the signals output from the inverting output terminal $\overline{U}$ and the output terminal D of the phase comparator 4 are the same in the apparatus arranged as described above, the output FC of the amplifier A1 is constant. When the pulse width of the signal output from the inverting output terminal $\overline{U}$ of the phase comparator 4 is larger, the output FC of the amplifier A1 becomes larger, and when the pulse width of the signal output from the output terminal D of the phase comparator 4 is larger, the output FC of the amplifier A1 becomes smaller.

As described above, when the output FC of the amplifier A1 changes according to each output of the phase comparator 4, the voltage-controlled oscillator (VCO) 6 is controlled according to the changes of the output FC, and the frequency and phase of the sampling clock SC change accordingly. The sampling clock SC is output from the voltage-controlled oscillator 6 to the divider 7, and then fed back to the phase comparator 4 from the divider 7. By repeating this processing, the sampling clock SC is synchronized with the binary reproduction signal RF2.

With the above-described processing, as shown in FIG. 12, the binary reproduction signal RF2 and the sampling clock SC are synchronized during the forward PLL synchronizing signal 200, and the output signal $\overline{SY}$ of the synchronizing-signal detector 2 changes from high to low when the detector 2 detects the data-read-start-position synchronizing signal 201 (point B in FIG. 12). Then, the signals input to the OR gate G1 and the AND gate G3 of the time-constant switcher 8 are prevented from passing through the gates as is, and the output $\overline{U2}$ of the OR gate G1 becomes high and the output D2 of the AND gate G3 becomes low.

In this case, when both the output $\overline{U2}$ of the OR gate G1 and the phase-lead signal D1 of the phase comparator 4 are lower than the reference voltage ref2, a current flows from the output of the amplifier A1 through the capacitor C1, resistor R3, resistor R1, and diode D1, charging the capacitor C1 to increase the output of the amplifier A1. The time constant $\tau_U$ of the charge pump/loop filter 5 is the product of R1 and C1, which is as large as before the data-read-start-position synchronizing signal 201 is detected, by a factor of (R1+R4)÷R4. This means that the frequency band of the charge pump/loop filter 5 becomes narrower.

On the contrary, when both the output $\overline{U2}$ of the OR gate G1 and the phase-lead signal D1 of the phase comparator 4 are higher than the reference voltage ref2, a current flows from the output terminal D of the phase comparator 4 through the diode D2, resistor R2, resistor R3, and capacitor C1 to the output of the amplifier A1, discharging the capacitor C1 to reduce the output of the amplifier A1. The time constant $\tau_D$ of the charge pump/loop filter 5 is the product of R2 and C1, which is as large as before the data-read-start-position synchronizing signal 201 is detected, by a factor of (R2+R5)÷R5. This also means that the frequency band of the charge pump/loop filter 5 becomes narrower.

After the synchronizing-signal detector 2 detects the data-read-start-position synchronizing signal 201, the synchronizing-signal detector 2 maintains its output signal $\overline{SY}$ to the low level until it detects a data-read-end-position synchronizing signal 203.

In the above-described condition, when the sychronizing-signal detector 2 detects the data-read-end-position synchronizing signal, the synchronizing-signal detector switches its output signal $\overline{SY}$ from low to high, and maintains the high level until it detects the data-read-start-position synchronizing signal 201 in the next block.

The operation of the synchronizing-signal detector 2 will be described below in detail.

Figure 13:
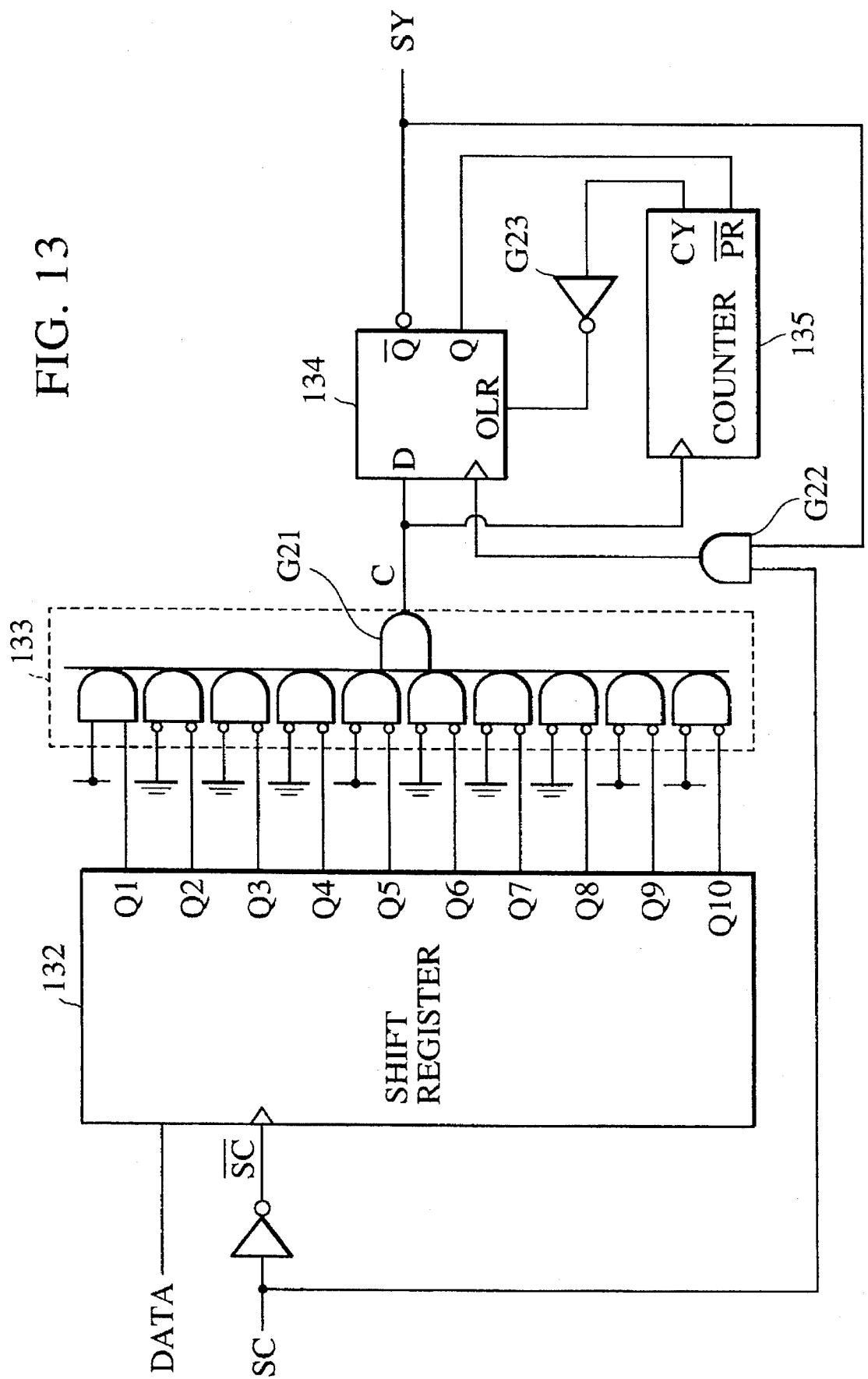
FIG. 13 is a block diagram illustrating an example configuration of the synchronizing-signal detector shown in FIG. 11.

FIG. 13 is a circuit diagram illustrating an outlined configuration of the synchronizing-signal detector 2 used in the optical information reproduction apparatus of the present embodiment.

In FIG. 13, the synchronizing-signal detector 2 comprises a shift register 132, a decoder 133, a D flip-flop 134, and a counter 135. Each section will be described below.

The shift register 132 has one input terminal which is connected to the output line of the D flip-flop 3 and the other input terminal which is connected to the output line of the divider 7, and output terminals Q1 to Q10. This shift register 132 performs serial-parallel conversion in synchronization with the rising edge of the inverting input $\overline{SC}$ of the sampling clock SC.

The decoder 133 comprises plural logical circuits: AND gates G11 to G20 which correspond to the output terminals Q1 to Q10 of the shift register 132, and an AND gate G21 which receives the outputs of the AND gates G11 to G20. This decoder 133 compares all the bits corresponding to the signals serial-parallel converted in the shift register 132 with the pattern (1100010001) of the data-read-start-position synchronizing signal 201.

The D flip-flop 134 outputs the signal $\overline{SY}$ to the phase comparator 4 from the inverting output terminal $\overline{Q}$. The D flip-flop 134 has one input terminal D which is connected to the output (output of the AND gate G21) of the decoder 133, and the other input terminal which is connected to the output line of the AND gate G22 which receives the output of the divider 7 and the output sent from the inverting output terminal $\overline{Q}$. The output signal SY is output from the output terminal Q.

The counter 135 has two input lines which are connected to the output (output of the AND gate G21) of the decoder 133 and the output line of the output terminal Q of the D flip-flop 134, and one output line at the output terminal CY which is connected to the reset terminal CLR of the D flip-flop 134 through a NOT gate G23.

When the synchronizing-signal detector 2 detects a data-read-start-position synchronizing signal, the output C of the decoder 133 becomes high for a period of one clock of the inverting input $\overline{SC}$ of the sampling clock SC. The output C is latched by the D flip-flop 134 at the rising edge of the sampling clock SC, and the output $\overline{SY}$ of the inverting output terminal $\overline{Q}$ becomes low. Since an inter-data synchronizing signal 202 and a data-read-end-position synchronizing signal 203 have the same pattern as a data-read-start-position synchronizing signal 201, they are also detected by the decoder 133.

The counter 135 is set to the total number of synchronizing signals in one data block minus 1. The counter 135 decreases at the rising edge of the output C (detection pulse) of the decoder 133. When the counter 135 detects a data-read-termination signal 203, the output at the output terminal CY becomes high, resetting the D flip-flop 134.

When the D flip-flop 134 is reset by the counter 135, the output $\overline{SY}$ of the inverting output terminal $\overline{Q}$ of the D flip-flop 134 becomes high.

In the above-described embodiment, the counter 135 counts the number of synchronizing signals in one data block and resets the D flip-flop with the output from the output terminal CY. An MPU not shown may reset the D flip-flop 134.

While the PLL synchronizing signal is being input, the frequency band in which the operation of the PLL control signal generator is ensured is set broad in this embodiment. This enables the sampling clock to be synchronized with the reproduction signal quickly, and also enables the jitter of the RF signal caused by changes in the scanning speed for optical pits to be followed.

When a data-read-start-position synchronizing signal 201 is detected, the time constant of the charge pump/loop filter 5 is switched and the frequency band in which the operation of the PLL control signal generator is ensured is set narrow, almost preventing synchronization errors from occurring even if the reproduction signal is lost due to dust or scratches.

In the optical information reproduction apparatus of the present embodiment, input resistors for the charge pump/loop filter are connected in parallel through logic gates, and the time constant of the charge pump/loop filter is switched with use of the logic gates. The time constant of the charge pump/loop filter can be switched with changes in resistance by bypassing resistors connected in series using an analog switch. An optical information reproduction apparatus of another embodiment, wherein resistance changes by bypassing resistors connected in series using an analog switch, will be described below.

Figure 14:
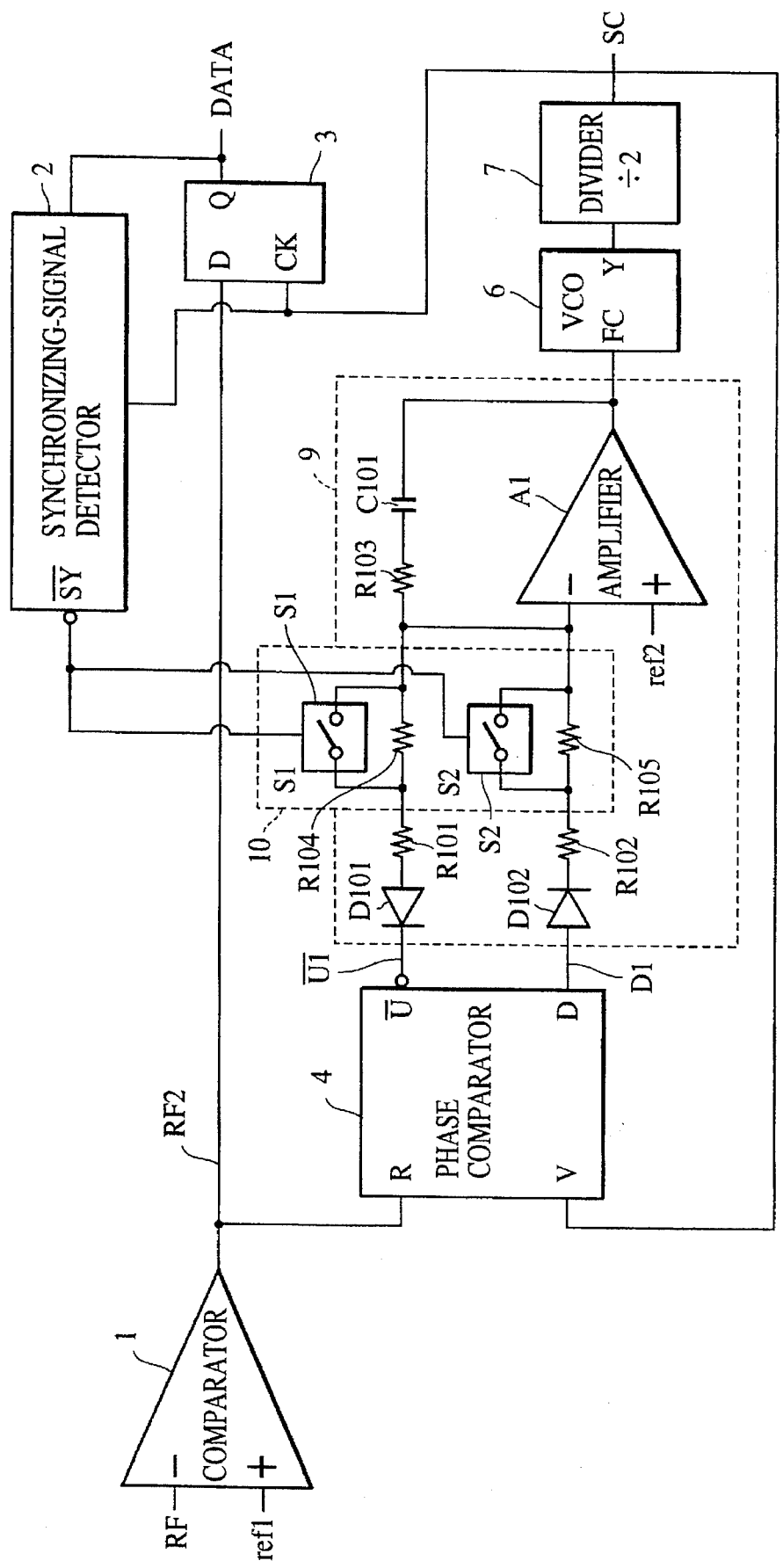
FIG. 14 is a block diagram illustrating an outlined configuration of a reproduction signal processing system, which is a main section of an optical information reproduction apparatus according to a second embodiment of the present invention.

FIG. 14 is a block diagram illustrating an outlined configuration of a reproduction signal processing system, which is a main section of an optical information reproduction apparatus according to a second embodiment of the present invention.

The optical information reproduction apparatus of the present embodiment has the same configuration as the optical information reproduction apparatus shown in FIG. 11 except that a charge pump/loop filter 9 and a time-constant switcher 10 (both described later) are used instead of the charge pump/loop filter 5 and the time-constant switcher 8. The same numerals as those used in FIG. 11 designate the same or equivalent sections in FIG. 14.

In this optical information reproduction apparatus, the charge pump/loop filter 9 includes an amplifier A1 in the same way as the optical information reproduction apparatus shown in FIG. 11. The inverting input terminal of the amplifier A1 is connected in parallel to the output line of the inverting output terminal $\overline{U}$ of the phase comparator 4 with a diode D101 and a resistor R101 being inserted in series, and the output line of the output terminal D of the phase comparator 4 with a diode D102 and a resistor R 102 being inserted in series. The other input terminal is connected to a reference voltage ref2. The output of the amplifier A1 is input to a voltage-controlled oscillator 6 and also fed back to the inverting input terminal in the same way as shown in the optical information reproduction apparatus shown in FIG. 11. In the feedback line, a resistor 103 and a capacitor C 101 are connected in series.

The time-constant switcher 10 comprises a switch S1 and a resistor R104 inserted in parallel between the resistors R101 and R103, and a switch S2 and a resistor R105 connected in parallel between the resistors R102 and R103. The switches S1 and S2 are controlled by the output $\overline{SY}$ of the synchronizing-signal detector 2. When the output $\overline{SY}$ of the synchronizing-signal detector 2 is high, the switches S1 and S2 are both on, and when the output $\overline{SY}$ of the synchronizing-signal detector 2 is low, the switches S1 and S2 are both off.

In the above-described optical information reproduction apparatus, the switches S1 and S2 are controlled according to the output $\overline{SY}$ of the synchronizing-signal detector 2. The time constant τ of the charge pump/loop filter 9 is switched according to the on/off state of the switches S1 and S2 as follows: When the output signal $\overline{SY}$ of the synchronizing-signal detector 2 is high, the switches S1 and S2 are both on. In this case, when the phase-lag signal $\overline{U1}$ of the phase comparator 4 and the phase-lead signal D1 of the phase comparator 4 are both lower than the reference voltage ref2, a current flows from the output of the amplifier A1 through the capacitor C101, resistor R103, switch S1, resistor R101, and diode D101 to the inverting output terminal $\overline{U}$ of the phase comparator 4. On the contrary, when the phase-lag signal $\overline{U1}$ of the phase comparator 4 and the phase-lead signal D1 of the phase comparator 4 are both higher than the reference voltage ref2, a current flows from the output terminal D of the phase comparator 4 through the diode D102, resistor R102, switch S2, resistor R103, and capacitor C1 to the output of the amplifier A1.

With the same processing as that performed in the optical information reproduction apparatus of the first embodiment, when the output signal $\overline{SY}$ of the synchronizing-signal detector 2 becomes low, both the switches S1 and S2 become off. In this case, when the phase-lag signal $\overline{U1}$ of the phase comparator 4 and the phase-lead signal D1 of the phase comparator 4 are both lower than the reference voltage ref2, a current flows from the output of the amplifier A1 through the capacitor C101, resistor R103, resistor R104, resistor R101, and diode D101 to the inverting output terminal $\overline{U}$ of the phase comparator 4. On the contrary, when the phase-lag signal $\overline{U1}$ of the phase comparator 4 and the phase-lead signal D1 of the phase comparator 4 are both higher than the reference voltage ref2, a current flows from the output terminal D of the phase comparator 4 through the diode D102, resistor R102, resistor R105, resistor R103, and capacitor C1 to the output of the amplifier A1.

Therefore, when a current flows from the output of the amplifier A1 to the inverting output terminal $\overline{U}$ of the phase comparator 4, the time constant $\tau_U$ of the charge pump/loop filter 9 is the product of R101 and C101 if the switch S1 is on and the time constant $\tau_U$ is the product of R101+R104 and C101 if the switch S1 is Off. When a current flows from the output terminal D of the phase comparator 4 to the output of the amplifier A1, the time constant $\tau_D$ of the charge pump/loop filter 9 is the product of R102 and C101 if the switch S2 is on and the time constant $\tau_D$ is the product of R102+R105 and C101 if the switch S2 is off. In both cases, the frequency band of the charge pump/loop filter 9 becomes narrower.

As described above, in this embodiment, the time constant τ of the charge pump/loop filter 9 is switched by controlling the switch S1 and S2, enabling the same operation to be performed as that in the optical information reproduction apparatus according to the first embodiment.

Various types of time-constant switchers employing an analog switch can be used in the present embodiment. Another embodiment in which a time-constant switcher comprising an analog switch and capacitor inserted in the feedback line for the amplifier A1 in the charge pump/loop filter will be described below.

Figure 15:
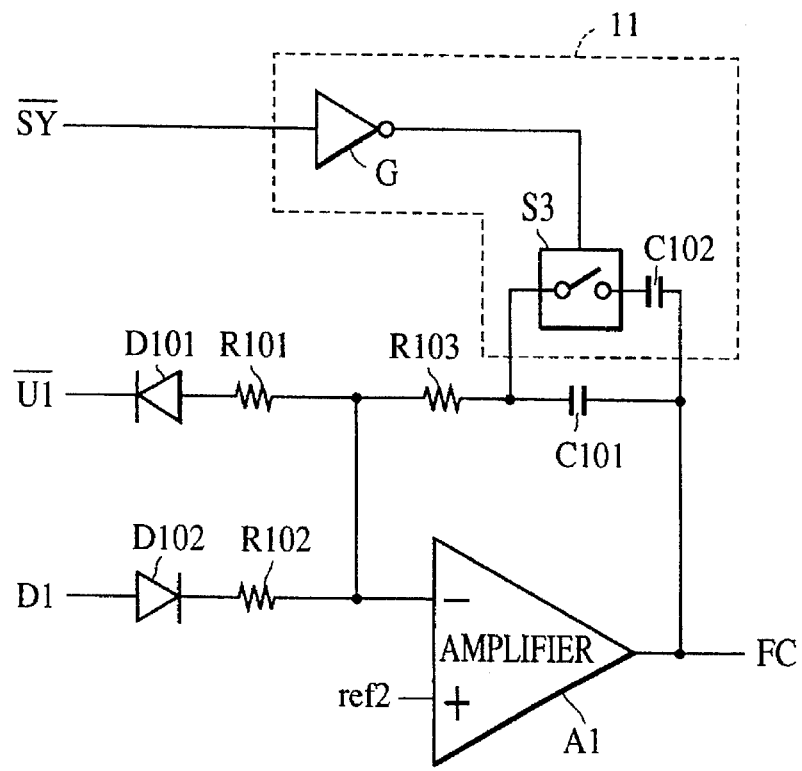
FIG. 15 is a block diagram illustrating the main portion of a time-constant switcher of an optical information reproduction apparatus according to a third embodiment of the present invention.

FIG. 15 is a circuit diagram illustrating the main portion of a time-constant switcher of an optical information reproduction apparatus according to a third embodiment of the present invention.

The optical information reproduction apparatus of the present embodiment has the same configuration as the optical information reproduction apparatus shown in FIG. 14 except that a time-constant switcher 11, described later, is used instead of the time-constant switcher 10. The same numerals as those used in FIG. 14 designate the same or equivalent sections in FIG. 15.

The time-constant switcher 11 used in this embodiment comprises a switch S3, a capacitor C102, and a NOT gate G101. The switch S3 and the capacitor C102 are connected in series in the time-constant switcher 11, and they are connected in parallel to the capacitor 101 placed in the feedback line for the amplifier A1 of the charge pump/loop filter 9. The output $\overline{SY}$ of the synchronizing-signal detector 2 is input to the switch S3 through the NOT gate G101. The switch S3 is off when the output signal $\overline{SY}$ of the synchronizing-signal detector 2 is high, and the switch S3 is on when the output signal $\overline{SY}$ is low.

In the optical information reproduction apparatus of the present embodiment, when the output signal $\overline{SY}$ of the synchronizing-signal detector 2 is high, a low signal is input to the switch S3 through the NOT gate G101 to set the switch S3 off.

In this case, when the phase-lag signal $\overline{U1}$ of the phase comparator 4 and the phase-lead signal D1 of the phase comparator 4 are both lower than the reference voltage ref2, a current flows from the output of the amplifier A1 through the capacitor C101, resistor R103, resistor R101, and diode D101 to the inverting output terminal $\overline{U}$ of the phase comparator 4. On the contrary, when the phase-lag signal $\overline{U1}$ of the phase comparator 4 and the phase-lead signal D1 of the phase comparator 4 are both higher than the reference voltage ref2, a current flows from the output terminal D of the phase comparator 4 through the diode D102, resistor R102, resistor R103, resistor R103, and capacitor C101 to the output of the amplifier A1. With the same processing as that used in the optical information reproduction apparatus of the first embodiment, when the output signal $\overline{SY}$ of the synchronizing-signal detector 2 becomes low, the switch S3 becomes on.

In this state, when the phase-lag signal $\overline{U1}$ of the phase comparator 4 and the phase-lead signal D1 of the phase comparator 4 are both lower than the reference voltage ref2, a current flows from the output of the amplifier A1 through both the capacitor C101 and capacitor C102, resistor R103, resistor R101, and diode D101 to the inverting output terminal $\overline{U}$ of the phase comparator 4. On the contrary, when the phase-lag signal $\overline{U1}$ of the phase comparator 4 and the phase-lead signal D1 of the phase comparator 4 are both higher than the reference voltage ref2, a current flows from the output terminal D of the phase comparator 4 through the diode D102, resistor R102, resistor R103, and both capacitors C101 and C102 to the output of the amplifier A1.

Therefore, when a current flows from the output of the amplifier A1 to the inverting output terminal U of the phase comparator 4, and when a current flows from the output terminal D of the phase comparator 4 to the output of the amplifier A1, the time constant τ of the charge pump/loop filter 9 is as large as before the switch S3 becomes on, by a factor of {(C101+C102)÷C101}. In both cases, the frequency band of the charge pump/loop filter 9 becomes narrower.

In the above-described time-constant switcher 11, the same operation is achieved when the switch S3 and the capacitor C102 connected in parallel is inserted between the output of the amplifier A1 and the capacitor C101 in series.

Figure 16:
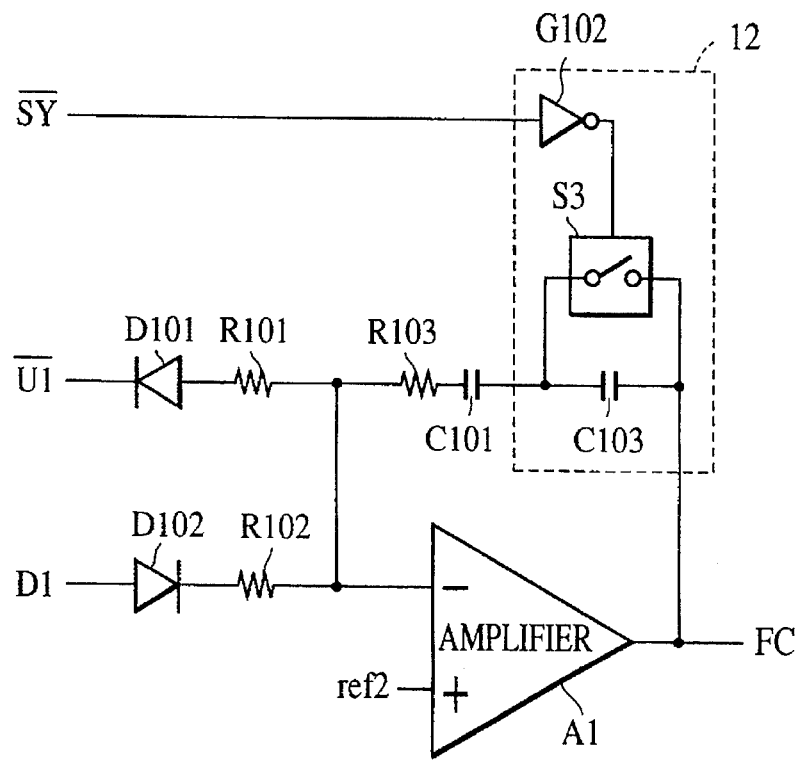
FIG. 16 is a block diagram of another example of the time-constant switcher shown in FIG. 15.

FIG. 16 is a circuit diagram of another time-constant switcher 12, which is a modified one of the time-constant switcher 11 shown in FIG. 15.

In FIG. 16, a switch S4 and a capacitor C103 connected in parallel is inserted between the output of an amplifier A1 and a capacitor C101 in series in the time-constant switcher 12. The output signal $\overline{SY}$ of the synchronizing-signal detector 2 is input to the switch S4 through a NOT gate G102. When the output signal $\overline{SY}$ of the synchronizing-signal detector 2 is high, the switch S4 is off, and when the output signal $\overline{SY}$ is low, the switch S4 is on.

In the time-constant switcher 12 configured as described above, the capacitor C 103 is bypassed when the output signal $\overline{SY}$ of the synchronizing-signal detector 2 is low, because the switch S4 is on.

Therefore, when a current flows from the output of the amplifier A1 to the inverting output terminal $\overline{U}$ of the phase comparator 4, and when a current flows from the output terminal D of the phase comparator 4 to the output of the amplifier A1, the time constant τ of the charge pump/loop filter 9 is as large as before the switch S4 is off by a factor of {(C101+C103)÷C103}. In the same way as the first embodiment, this indicates that the frequency band of the charge pump/loop filter 9 becomes narrower.

As described above, also in the optical information reproduction apparatuses shown in FIGS. 15 and 16, the same operation as the optical information reproduction apparatus of the first embodiment can be achieved.

What is claimed is:

1. An apparatus for reproducing information from an optical information recording medium comprising an area for recording a phase-locked-loop synchronizing signal and an area for recording data, and a specific signal recorded between the two areas, said apparatus comprising:

means for generating a reproduction signal by scanning the recording medium with an optical beam;

a specific-signal detector for detecting the specific signal from the reproduction signal;

a binary-conversion circuit for converting the reproduction signal to a binary signal;

a sampling-clock generating circuit for generating a sampling clock, synchronized with the binary reproduction signal; and a reproduction circuit for reproducing information by sampling the binary reproduction signal with the sampling clock, wherein said sampling-clock generating circuit comprises (i) a phase comparator for generating a phase-comparing signal by comparing a phase of the binary reproduction signal with that of the sampling clock, (ii) a low-pass filter comprising an amplifier into which the phase-comparing signal is inputted through two resistors which are connected to each other in series and which comprises a feedback circuit, (iii) a switch which is connected in parallel with one of said two resistors and is used as a non-continuity when said specific-signal detector detects the specific signal, and (iv) a voltage-controlled oscillator which generates the sampling clock, which has a frequency proportional to that of an outputted voltage of said low-pass filter.

2. An apparatus for reproducing information from an optical information recording medium comprising an area for recording a phase-locked-loop synchronizing signal and an area for recording data, and a specific signal recorded between the two areas, said apparatus comprising:

means for generating a reproduction signal by scanning a recording medium with an optical beam;

a specific-signal detector for detecting the specific signal from the reproduction signal;

a binary-conversion circuit for converting the reproduction signal to a binary signal;

a sampling-clock generating circuit for generating a sampling clock synchronized with the binary reproduction signal; and a reproduction circuit for reproducing information by sampling the binary reproduction signal with the sampling clock, wherein said sampling-clock generating circuit comprises (i) a phase-comparator which generates a phase-comparing signal by comparing a phase of the binary reproduction signal and that of the sampling clock, (ii) a low-pass filter comprising an amplifier into which the phase-comparing signal is inputted and which comprises a feedback circuit which includes a first condenser and a second condenser, connected in parallel with the first condenser through a switch which is used as a continuity when said specific-signal detector detects the specific signal, and (iii) a voltage-controlled oscillator which generates the sampling clock, which has a frequency proportional to that of a voltage output by said low-pass filter.

3. An optical information reproduction apparatus for reproducing information from an optical information recording medium comprising an area for recording a phase-locked-loop synchronizing signal and an area for recording data, and a specific signal recorded between the two areas, said apparatus comprising:

means for generating a reproduction signal by scanning the recording medium with an optical beam;

a specific-signal detector for detecting the specific signal from the reproduction signal;

a binary-conversion circuit for converting the reproduction signal to a binary signal;

a sampling-clock generating circuit for generating a sampling clock synchronized with the binary reproduction signal; and a reproduction circuit for reproducing information by sampling the reproduction signal with the sampling clock, wherein said sampling-clock generating circuit comprises (i) a phase-comparator which generates a phase-comparing signal by comparing a phase of the binary reproduction signal with that of the sampling clock, (ii) a low-pass filter which comprises an amplifier into which the phase-comparing signal is inputted and which comprises a feedback circuit which comprises two condensers connected in series to each other, (iii) a switch which is connected in parallel with one of said two condensers and is used as a continuity when said specific-signal detector detects the specific signal, and (iv) a voltage-controlled oscillator which generates the sampling clock, which has a frequency proportional to that of an outputted voltage of said low-pass filter.

* * * * *

UNITED STATES PATENT AND TRADEMARK OFFICE
CERTIFICATE OF CORRECTION

PATENT NO. : 5,633,855
DATED : May 27, 1997
INVENTOR(S) : YUICHI NAITO

It is certified that error appears in the above-identified patent and that said Letters Patent is hereby corrected as shown below:

Column 13

Line 50, "Contrary" should read --¶ Contrary--.

Column 14

Line 48, "(R1+R4)+R4" should read --(R1+R4)÷R4--.

Column 17

Line 41, "Off." should --off.--.

Column 18

Line 32, "With" should read --¶ With--.

Signed and Sealed this

Second Day of December, 1997

Attest:

BRUCE LEHMAN

Attesting Officer      Commissioner of Patents and Trademarks